US007002284B2

(12) United States Patent
Ouchi et al.

(10) Patent No.: US 7,002,284 B2
(45) Date of Patent: Feb. 21, 2006

(54) THIN-FILM MICROMECHANICAL RESONATOR, THIN-FILM MICROMECHANICAL RESONATOR GYRO, AND NAVIGATION SYSTEM AND AUTOMOBILE USING THE RESONATOR GYRO

(75) Inventors: Satoshi Ouchi, Hyogo (JP); Toshiyuki Nozoe, Kyoto (JP); Koji Nomura, Nara (JP); Hirofumi Tajika, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 98 days.

(21) Appl. No.: 10/470,669

(22) PCT Filed: Nov. 26, 2002

(86) PCT No.: PCT/JP02/12310

§ 371 (c)(1),
(2), (4) Date: Dec. 11, 2003

(87) PCT Pub. No.: WO03/052350

PCT Pub. Date: Jun. 26, 2003

(65) Prior Publication Data

US 2004/0095046 A1    May 20, 2004

(30) Foreign Application Priority Data

Nov. 27, 2001  (JP) .............................. 2001-360560
Oct. 15, 2002  (JP) .............................. 2002-300116

(51) Int. Cl.
*H03H 9/21* (2006.01)

(52) U.S. Cl. ...................... 310/370; 310/364; 310/366; 333/200

(58) Field of Classification Search ................ 310/370, 310/364–366; 333/200
See application file for complete search history.

(56) References Cited

U.S. PATENT DOCUMENTS 5,438,231 A      8/1995  Khoshnevisan et al. ..... 310/321
6,018,996 A  *  2/2000  Matsuhiro et al. ....... 73/504.12

FOREIGN PATENT DOCUMENTS

JP           55-49020 A      4/1980

(Continued)

OTHER PUBLICATIONS

International Search Report for PCT International Application No. PCT/JP02/12310 mailed Mar. 4, 2003.

(Continued)

*Primary Examiner*—Darren Schuberg
*Assistant Examiner*—J. Aguirrechea
(74) *Attorney, Agent, or Firm*—RatnerPrestia

(57) ABSTRACT

A thin film micromechanical resonator (resonator) having improved drive efficiency, a resonator gyro having improved sensitivity in detecting an angular velocity, and a navigation system and an automobile using the resonator gyro. The resonator includes a tuning fork structure made of a non-piezoelectric material, and a first electrode and a second electrode disposed respectively at the inner side and the outer side of the tuning fork arm. On the first and second electrodes, a first piezo film and a second piezo film are provided respectively, and a third electrode and a fourth are respectively provided electrode thereon. When an alternating voltage is applied to the third and fourth electrodes at the opposite phases each other, the tuning fork resonates in the direction perpendicular to the center line. The resonator gyro detects, at the sensing section which is formed of another electrodes and another piezo film, the Coriolis force generated in proportion to angular velocity given to the resonator.

32 Claims, 13 Drawing Sheets

FOREIGN PATENT DOCUMENTS

| | | |
|---|---|---|
| JP | 57-160067 A | 10/1982 |
| JP | 2-218915 A | 8/1990 |
| JP | 4-38513 | 3/1992 |
| JP | 4-504617 A | 8/1992 |
| JP | 5-322579 A | 12/1993 |
| JP | 8-5382 A | 1/1996 |
| JP | 9-105634 A | 4/1997 |
| JP | 9-280868 A | 10/1997 |
| JP | 10-19574 A | 1/1998 |
| JP | 10-339637 A | 12/1998 |

OTHER PUBLICATIONS

Form PCT/ISA/210 English translation of ISR for PCT/JP02/12310 mailed Mar. 4, 2003.

Partial International Search Report for PCT/JP02/12310 mailed Jan. 14, 2003.

* cited by examiner

THIN-FILM MICROMECHANICAL RESONATOR, THIN-FILM MICROMECHANICAL RESONATOR GYRO, AND NAVIGATION SYSTEM AND AUTOMOBILE USING THE RESONATOR GYRO

THIS APPLICATION IS A U.S. NATIONAL PHASE APPLICATION OF PCT INTERNATIONAL APPLICATION PCT/JP02/12310.

TECHNICAL FIELD

The present invention relates to a thin film micromechanical resonator, a thin film micromechanical resonator gyro, and a navigation system and an automobile using the thin film micromechanical resonator gyro.

BACKGROUND ART

A conventional thin film micromechanical resonator gyro is disclosed in, for example, U.S. Pat. No. 5,438,231.

The resonator gyro is described referring to FIG. 14 and FIG. 15.

FIG. 14 shows a perspective view of the resonator gyro.

FIG. 15 shows a cross sectional view of the resonator gyro at the drive section, sectioned along the line 15—15 of FIG. 14.

Referring to FIG. 14, tuning fork 101 has two arms 102, 103 made of non-piezoelectric material. Piezoelectric thin films 104 and 105 are disposed on the main surface of respective arms 102 and 103 of tuning fork 101. Electrodes 106, 107, 108, 109, 110 and 111 are coupled with respective piezoelectric thin films 104, 105. Application of an alternating voltage to electrodes 107, 108, 110 and 111 causes tuning fork 101 to resonate.

In FIG. 15, a space of width 131 is shown on piezoelectric thin film 104 with respect to center line 121 of arm 102, where there is no electrodes 107, 108 provided above. Arrow mark 141 indicates the direction of electric field working to piezoelectric thin film 104 from electrode 107 to electrode 108.

In the above-described thin film micromechanical resonator gyro, electrode 106 opposing to respective electrodes 107 and 108 has a continuous sheet form. As a result, a component of electric field as indicated by arrow mark 141 readily arises. The component is irrelevant to the driving of resonator gyro.

Piezoelectric thin film 104 disposed beneath electrodes 107 and 108 also has a continuous sheet form. As a result, when piezo film 104 at the portion sandwiched by electrode 107 and electrode 106 tries to stretch in the Y axis direction, for example, piezo film 104 corresponding to the portion of width 131 retards the stretching try. In the same manner, when piezo film 104 at the portion sandwiched by electrode 108 and electrode 106 tries to shrink in the Y axis direction, the portion of width 131 retards the shrinking try.

The drive efficiency of tuning fork 101 is sometimes deteriorated by the above described factors.

DISCLOSURE OF INVENTION

A thin film micromechanical resonator of increased drive efficiency, a thin film micromechanical resonator gyro having an improved sensitivity of detecting a given angular velocity taking advantage of the increased drive efficiency, a navigation system and an automobile using the thin film micromechanical resonator gyro are proposed.

In a thin film micromechanical resonator in the present invention (hereinafter referred to as resonator), the tuning fork is formed of non-piezoelectric material having at least two arms and at least one stem coupling the arms.

A first electrode is provided at a place inner than the center line in at least one main surface of at least one of the arms.

A second electrode is provided on the main surface and at a place outer than the center line with a separation from the first electrode. A first piezoelectric thin film is provided on the first electrode. A second piezoelectric thin film is provided on the second electrode. A third electrode is provided on the first piezoelectric thin film. A fourth electrode is provided on the second piezoelectric thin film.

When an alternating voltage is applied on the third and fourth electrodes at opposite phases each other, the tuning fork resonates in the direction perpendicular to the center line on the arm's main surface (X direction).

In the above configuration, a component of electric field that does not contribute to the drive is reduced, and the stretching/shrinking of piezoelectric thin film is not disturbed. Therefore, the drive efficiency in a thin film micromechanical resonator is improved.

A resonator gyro in the present invention is, like the above resonator, is formed of non-piezoelectric material having at least two arms and at least one stem coupling the arms.

Drive section includes the above-described first electrode, first piezoelectric thin film, third electrode, second electrode, second piezoelectric thin film and fourth electrode. When the third and the fourth electrodes are applied with an alternating voltage at opposite phases each other, the tuning fork resonates in the X direction.

The sensing section is provided on at least one main surface of at least one of the arms. The sensing section detects flexion of arm in the direction perpendicular to the main surface (Z direction) due to the Coriolis force caused by a given angular velocity. The result of detection is delivered in the form of either an electrical output or an optical output.

In the above-described configuration, a component of electric field that does not contribute to drive is reduced, and the stretching/shrinking of piezoelectric thin film is not disturbed. Therefore, drive efficiency in the gyro is increased, and the sensitivity of detecting a given angular velocity is improved.

A resonator gyro in the present invention further includes following sensing section and lead portion.

The sensing section includes a fifth electrode, a third piezoelectric thin film and a sixth electrode.

The fifth electrode is provided on the main surface with a separation from the first and the second electrodes, and at a place closer to the end of arm than the first and the second electrodes. The third piezoelectric thin film is provided on the fifth electrode, and the sixth electrode on the third piezoelectric thin film.

The lead portion includes a first lead out electrode and a second lead out electrode.

The first lead out electrode is provided between the first and the second electrodes with a separation from these electrodes, and is connected with the fifth electrode. A fourth piezoelectric thin film is provided on the first lead out electrode. The second lead out electrode is provided on the fourth piezoelectric thin film, and connected with the sixth electrode.

Electric charges caused by vibration due to the flexion of arm are detected by the sixth electrode.

In the above-described configuration, the component of electric field making no contribution to drive is reduced, and the stretching/shrinking of piezoelectric thin film is not disturbed. Consequently, the drive efficiency in the gyro is increased, and the sensitivity of detecting a given angular velocity is improved.

Furthermore, the fourth piezoelectric thin film is used also as insulating film between the first lead out electrode and the second lead out electrode. This structure reveals its particular advantage when manufacturing the gyros in volume.

These resonator gyros find their applications in the navigation systems.

Furthermore, these resonator gyros can be used in an automobile as a sensor for detecting either one item among the yaw rate, rolling and pitching.

DETAILED DESCRIPTION OF PREFERRED EMBODIMENTS

Preferred embodiments of the present invention are described below referring to FIG. 1 through FIG. 13.

(Embodiment 1)

Figure 1:
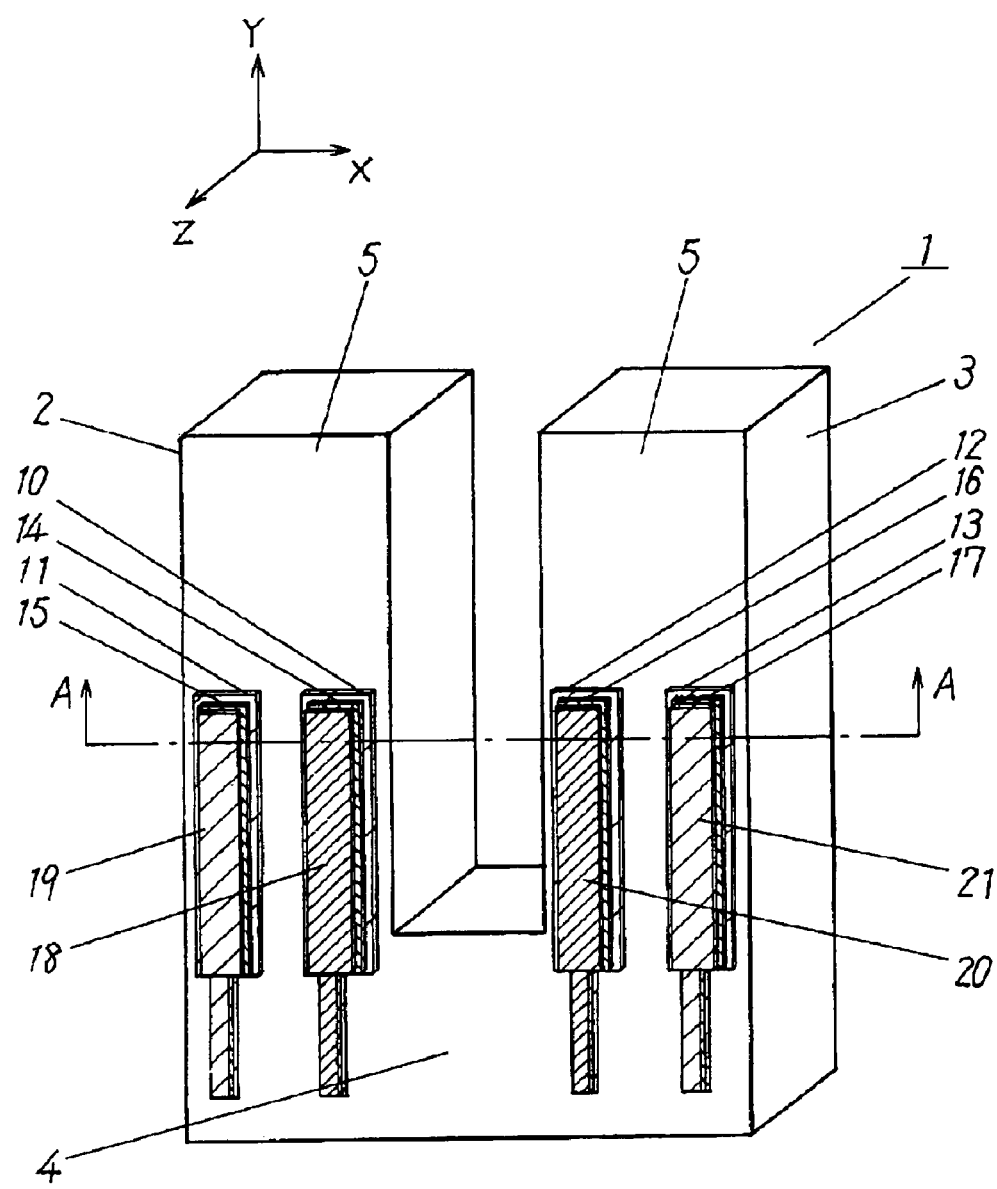
FIG. 1 shows a perspective view of a thin film micromechanical resonator in accordance with a first exemplary embodiment of the present invention.

FIG. 1 shows a perspective view of a thin film micromechanical resonator in embodiment 1.

Figure 2:
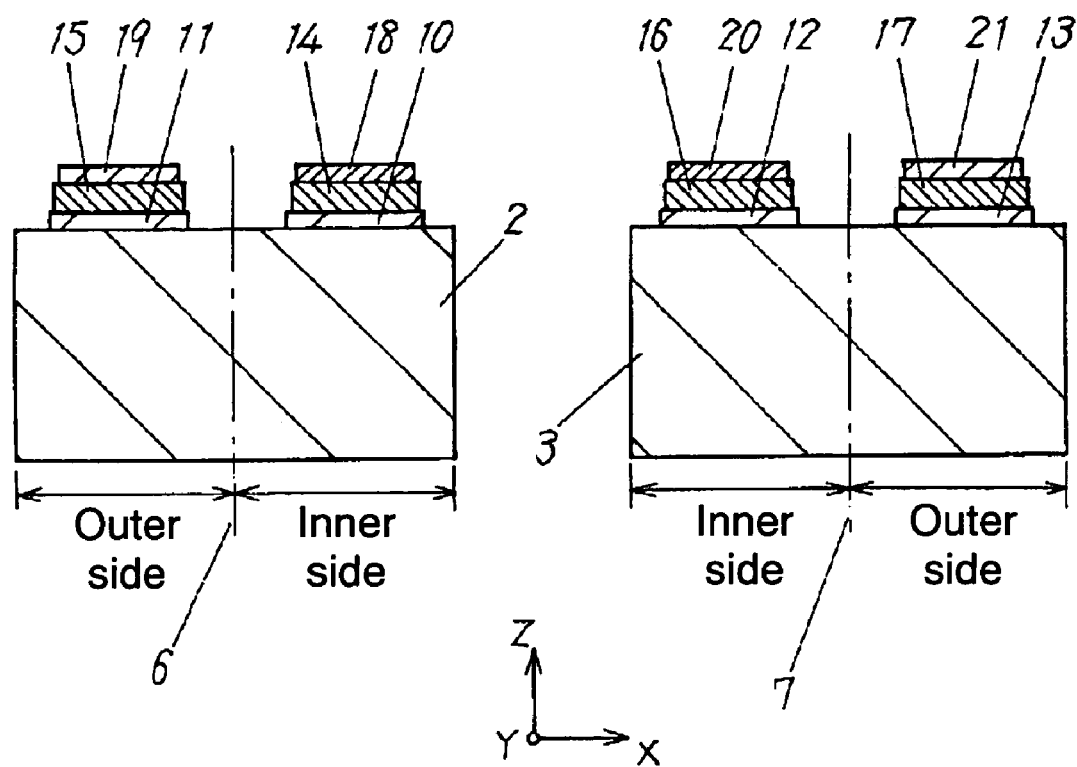
FIG. 2 is a cross sectional view of the resonator in embodiment 1, showing the arms sectioned along the line 2—2.

FIG. 2 is a cross sectional view of the resonator, showing the arms sectioned along the line 2—2.

Figure 3:
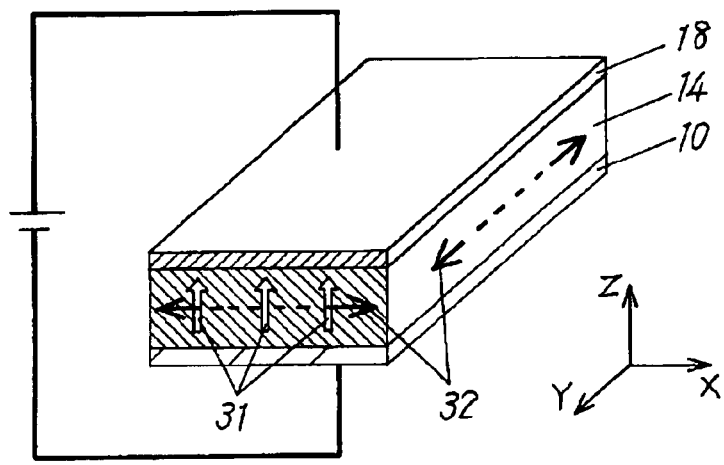
FIG. 3 is a perspective view of the resonator in embodiment 1, used to describe how the drive section works.

FIG. 3 is a perspective view, used to describe operation of the drive section.

Figure 4:
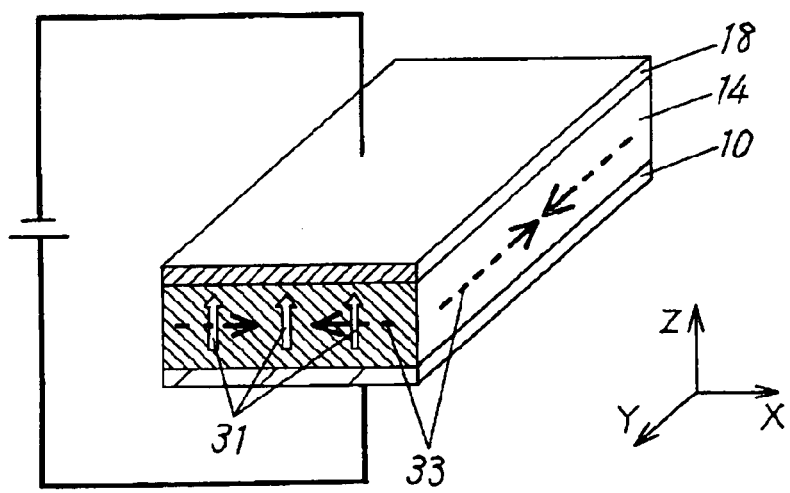
FIG. 4 is a perspective view of the resonator in embodiment 1, used to describe how the drive section works.

FIG. 4 is a perspective view, used to describe operation of the drive section.

Figure 5:
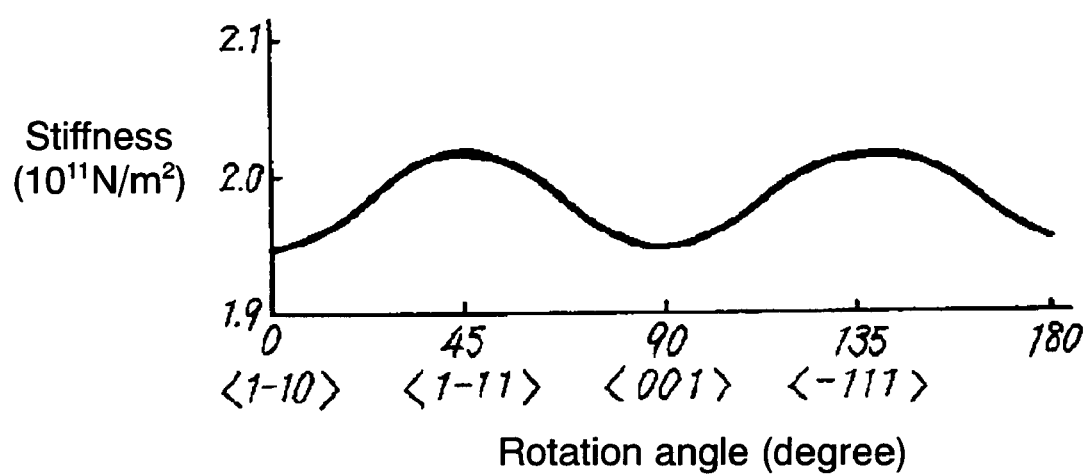
FIG. 5 is a characteristics chart showing the stiffness of material forming the arm of resonator in embodiment 1.

FIG. 5 is a characteristics chart showing the stiffness of material forming the arm of the resonator.

Figure 6:
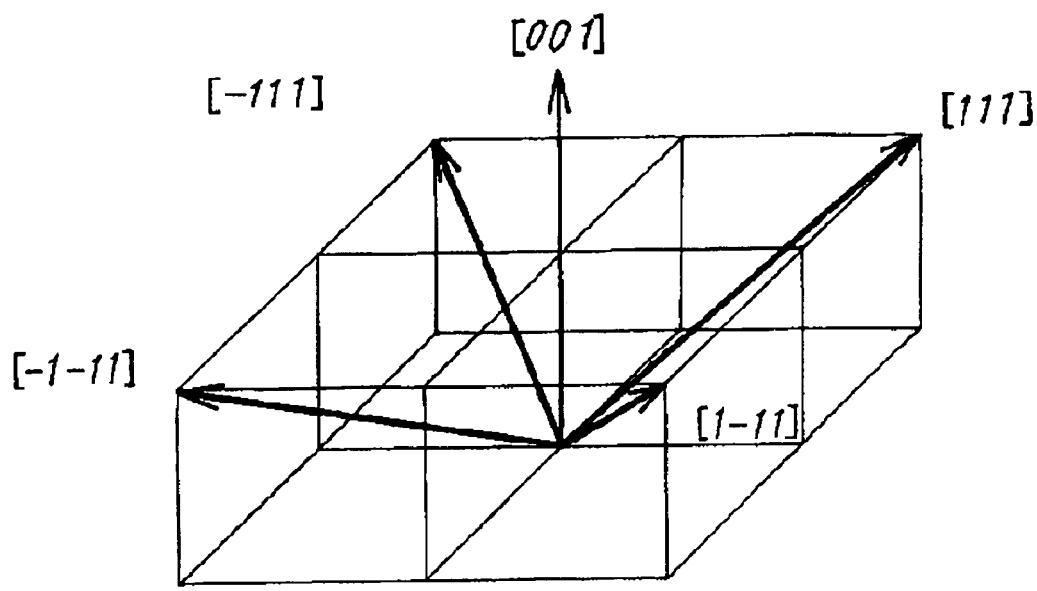
FIG. 6 illustrates state of polarization in the piezoelectric thin film having a rhombohedral crystalline structure.

FIG. 6 illustrates state of polarization in the piezoelectric thin film having a rhombohedral crystalline structure.

Figure 7:
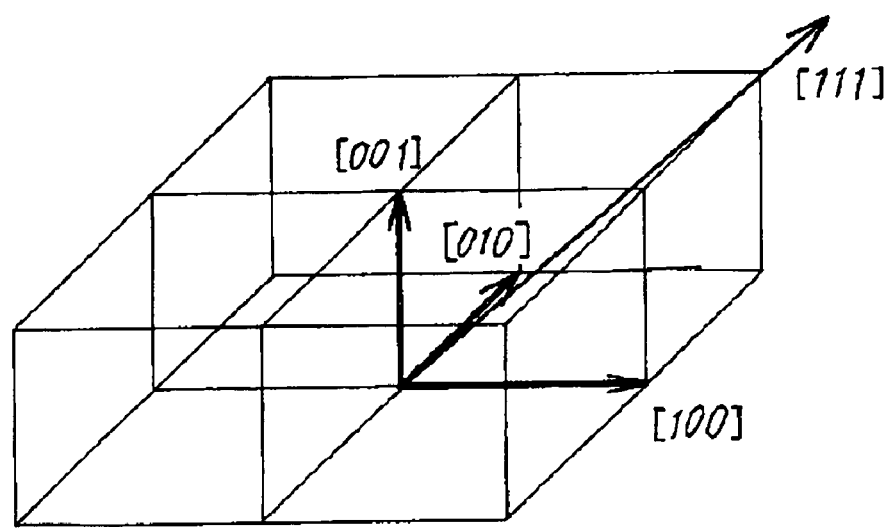
FIG. 7 illustrates state of polarization in the piezoelectric thin film having a tetragonal crystalline structure.

FIG. 7 illustrates state of polarization in the piezoelectric thin film having a tetragonal crystalline structure.

Referring to FIG. 1 through FIG. 4, the thin film micromechanical resonator (hereinafter referred to resonator) has been formed in the following structure.

Resonator 1 includes arms 2, 3 and stem 4, and has main surface 5.

Each of the arms 2, 3 is divided by center line 6, 7 into the outer side and the inner side.

First electrode 10 and second electrode 11 are provided on main surface 5 of arm 2 in the places inner and outer to center line 6, respectively, with a separation in between.

Another first electrode 12 and another second electrode 13 are provided on main surface 5 of arm 3 in the places inner and outer to center line 7, respectively, with a separation in between.

First piezoelectric thin films 14, 16 are provided on first electrodes 10, 12, respectively.

Second piezoelectric thin films 15, 17 are proved on second electrodes 11, 13, respectively.

Third electrodes 18, 20 are provided on first piezoelectric thin films 14, 16, respectively.

Fourth electrodes 19, 21 are provided on second piezoelectric thin films 15, 17, respectively.

Resonator 1 is formed on a tuning fork of silicon (Si), which has two arms 2, 3 and stem 4 connecting the arms 2, 3.

As described earlier, first piezo film 14 and second piezo film 15 on arm 2 are separated to each other, with center line 6 in between. In the same manner, first piezo film 16 and second piezo film 17 on arm 3 are separated to each other, with center line 7 in between. Third electrode 18 and fourth electrode 19 are also separated to each other with center line 6 in between. Third electrode 20 and fourth electrode 21 are also separated to each other with center line 7 in between.

Figure 16:
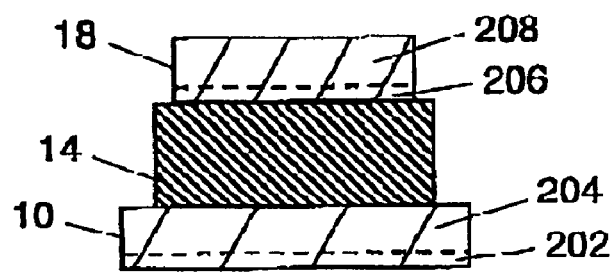
FIG. 16 is a partial enlarged view of FIG. 2.

FIG. 16 is a partial enlarged view of FIG. 2 that shows a configuration of first electrode 10, first piezoelectric thin films 14 and third electrodes 18. First electrode 12, first piezoelectric thin films 16 and third electrodes 20, and second electrodes 11, 13, second piezoelectric thin films 15, 17 and fourth electrodes 19, 21 are respectively configured in the same manner.

Both first piezo films 14, 16 and second piezo films 15, 17 are made of lead zirconate titanate (PZT).

A process of manufacturing resonator 1 is described in short.

First, a (110) crystal plane Si wafer of about 0.2 mm thick is prepared.

On the Si wafer, a Ti layer 202 is formed by sputtering or vapor deposition for about 100 Å thick to provide the lower part of first electrodes 10, 12 and second electrodes 11, 13. On this layer, a layer of Pt—Ti or the like material 204 is formed by sputtering or vapor deposition process for about 4000 Å thick to provide the upper part of these electrodes.

Next, on the above-described layer, a layer (not shown) of lead titanate added with lanthanum and magnesium (PLMT) is formed by sputtering for about 200 Å thick, such that the layer facilitates a wider range of allowance for manufacturing conditions to accomplish a superior orientation of piezoelectric thin film of, for example, PZT.

On the above-described layer, lead zirconate titanate (PZT) is sputtered for a thickness of about 2–3 μm as first piezo films 14, 16 and second piezo films 15, 17.

And then, a layer of Ti 206 is formed by sputtering or vapor deposition process for a thickness of about 25 Å as lower part of third electrodes 18, 20 and fourth electrodes 19, 21. The material for forming the upper part, Au, Cr, Al, Cu, Ti, etc. 208 is sputtered or vapor deposited thereon for a thickness of about 3000 Å.

The Ti layer facilitates a tight adhesion between the piezo film of PZT, etc. and Au film. The Au film has a low electric resistance, and provides an upper electrode of stable property.

Then it is processed using photo-lithographic technique and dry-etching process to accomplish third electrodes 18, 20 and fourth electrodes 19, 21, first piezo films 14, 16 and second piezo films 15, 17, PLMT film, first electrodes 10, 12 and second electrodes 11, 13, arms 2, 3, and stem 4. Resonator 1 of tuning fork as shown in FIG. 1 and FIG. 2 is thus provided.

In the meantime, patterning is made so that the vibrating direction of resonator 1 (X direction) is right-angled to the (1-11) crystal plane or the (-111) crystal plane of Si. By so doing, the material can be utilized so that a direction, which exhibits the high Young's modulus, i.e. the high stiffness, coincides with the vibrating direction. Thus, resonator 1 having a high intrinsic resonance frequency can be made available.

Resonator 1 thus manufactured measures, overall width 1 mm, overall length 5 mm, and total thickness about 0.2 mm; the resonance frequency at primary mode f in drive direction (X direction) is 17 kHz.

Now, the operating principle of resonator 1 is described below.

In FIG. 3 and FIG. 4, arrow marks 31 represents the direction of polarization, while arrow marks 32 and 33 the direction of stretching/shrinking of first piezo film 14.

Referring to FIG. 3 and FIG. 4, when a DC voltage of about 20V is applied between first electrode 10 and third electrode 18, the polarization vector in first piezo film 14 sandwiched between electrodes 10, 18 is oriented to one direction.

If the positive DC voltage is applied to first electrode 10, while third electrode 18 with the negative voltage, the polarization vector is oriented to the direction as indicated by arrow mark 31.

Although the above description refers only to first piezo film 14, first piezo film 16 and second piezo films 15, 17 also behave likewise; the polarization vector is oriented to the direction of arrow mark 31.

When a voltage is applied to first piezo film 14 so that the potential is higher at third electrode 18 than first electrode 10, as shown in FIG. 3, first piezo film 14 stretches in the direction of arrow mark 32, which is perpendicular to the polarization vector indicated by arrow mark 31. Contrary, when a voltage is applied so that the potential is lower at third electrode 18 than first electrode 10, as shown in FIG. 4, first piezo film 14 shrinks in the direction of arrow mark 33, which is perpendicular to polarization vector indicated by arrow mark 31.

Accordingly, when an alternating voltage is applied to third electrode 18 with first electrode 10 as the grounding (GND) electrode, or presumed as GND electrode, first piezo film 14 stretches/shrinks as indicated with arrow marks 32, 33.

In the above description, the drive section provided at the inner side on arm 2 has been described.

Other drive section provided at the outer side on arm 2, as well as drive sections provided at the inner side and outer side on arm 3, behave likewise.

When an alternating voltage having a 180° phase difference is applied to third electrode 18 and fourth electrode 19 shown in FIG. 2, first piezo film 14 stretches while second piezo film 15 shrinks, and vice versa.

In the same principle as described in the above, when an alternating voltage is applied to third electrodes 18, 20 at the same phase, while to fourth electrodes 19, 21 at the phase that is opposite of that to third electrodes 18, 20; then arms 2 and 3 vibrate to make a tuning fork resonance in X direction, the vibration made in the opposite directions to each other.

In order to bring the stretching/shrinking quantities of first piezo films 14, 16 and second piezo films 15, 17 into better balanced state for making the vibration of resonator 1 more stable, it is preferred to accomplish the following structure.

In respective arms 2 and 3, each of first electrodes 10, 12, second electrodes 11, 13, first piezo films 14, 16, second piezo films 15, 17, third electrodes 18, 20 and fourth electrodes 19, 21 is disposed substantially symmetrical to each other with respect to respective center lines 6 and 7.

By so doing, respective driving electric fields effective to first piezo films 14, 16 and second piezo films 15, 17 are well balanced. As a result, first piezo films 14, 16 and second piezo films 15, 17 generate equal amount of stretching/shrinking. Vibration in resonator 1 hardly deviates from the certain specific vibrating direction (X direction), and the driving capacity of resonator 1 is further improved.

Furthermore, respective arms 2, 3, as well as stem 4, forming resonator 1 are structured to be substantially symmetrical with respect to the axis running in parallel with arms 2, 3. By so doing, the resonance becomes stable.

In the present embodiment 1, description has been based on the structure where the first, second, third and fourth electrodes, and the first and second piezo films are disposed over both of arms 2, 3 of resonator 1, on one main surface 5.

Instead, resonator 1 may be driven for resonance by disposing the first, second, third and fourth electrodes, and the first and second piezo films on one main surface, or both main surfaces, of only one of the arms.

FIG. 5 is a stiffness characteristics chart of a (110) crystal plane Si wafer, showing the dependence on rotation angle.

Vertical axis represents the stiffness, while horizontal axis representing the angle of rotation corresponding to a direction. The origin is the <1-10> direction at which the rotation angle is zero degree.

It is understood from FIG. 5, that the stiffness reaches the highest at 45 degrees or 135 degrees. The rotation angles 45 degrees and 135 degrees correspond to <1-11> direction and <-111> direction, respectively. Accordingly, a resonator will have high intrinsic resonance frequency when the resonance direction is chosen to coincide with the <1-11> direction, <-1-11> direction, at which the stiffness is maximized.

FIG. 6 shows the polarization state of rhombohedral first and second piezo films 14, 16, 15 and 17 having the (001) crystal plane disposed to be parallel to main surface 5 of arms 2, 3 as shown in FIG. 1, after undergoing the polarization process in <001> direction.

The four polarization vector directions <111>, <1-11>, <-1-11> and <-111> are equivalent with respect to a driving electric field applied to in the <001> direction of first and second piezo films 14, 16, 15 and 17. Therefore, even if a great driving electric field is applied to resonator 1, the four polarization vectors do not revolve. As a result, hysteresis of piezo coefficient becomes small, and resonator 1 of small hysteresis is accomplished.

FIG. 7 shows other example of piezo film. The polarization state of tetragonal first piezo films 14, 16 and second piezo films 15, 17 having the (111) crystal plane disposed to be parallel to main surface 5 of arms 2, 3 as shown in FIG. 1, after undergoing the polarization process in <111> direction.

The three polarization vector directions <100>, <010> and <001> are equivalent with respect to an electric field applied to in <111> direction of first and second piezo films 14, 16, 15 and 17. Therefore, even if a great driving electric field is applied, the polarization vectors do not revolve. As a result, hysteresis of piezo coefficient is small.

Thus, resonator 1 of small hysteresis is accomplished.

The drive section formed of first electrodes 10, 12 and second electrodes 11, 13, first piezo films 14, 16, second piezo films 15, 17, third electrodes 18, 20 and fourth electrodes 19, 21 should preferably be disposed in a place from the middle on main surface 5 of respective arms 2, 3 towards the vicinity of stem 4, as shown in FIG. 1. This is because the admittance at secondary mode resonance frequency is small in the above-described arrangements, and a stable vibration is generated.

Detailed reasoning for that is as described in the following.

Suppose first electrodes 10, 12, second electrodes 11, 13, first piezo films 14, 16, second piezo films 15, 17, third electrodes 18, 20 and fourth electrodes 19, 21 are disposed in an area from the middle part towards the end of arms 2, 3 on main surface 5 of arms 2, 3. Then the admittance at secondary mode resonance frequency (f=110 kHz) in X direction becomes larger than that at primary mode resonance frequency (f=17 kHz) in the driving direction (X direction) of arms 2, 3 of resonator 1.

Therefore, even when resonator 1 is vibrating at the primary resonance frequency, for example, there exists a high possibility that it readily shifts to the secondary mode resonance frequency if some shock is given from outside.

In the above descriptions, first electrodes 10, 12 and second electrodes 11, 13 are assumed to be the GND electrode, or the virtual GND electrode. Third electrodes 18, 20 are applied with an alternating voltage at the same phase, while fourth electrodes 19, 21 at the phase that is opposite to that to third electrodes 18, 20.

First electrode 10 is separated from second electrode 11, so is first electrode 12 from second electrode 13. Therefore, alternating voltage may be applied to respective electrodes in the following manner.

Alternating voltage is applied to first electrodes 10, 12 and fourth electrodes 19, 21 at the same phase. Then, alternating voltage is applied to second electrodes 11, 13 and third electrodes 18, 20 at the same phase. The phase of alternating voltage applied to first electrodes 10, 12 is opposite to that applied to second electrodes 11, 13. The above arrangement makes it possible to enhance driving electric field applicable to respective piezo films 14, 16, 15 and 17. At the same time, the above arrangement makes it possible to fine-adjust the driving electric field applicable to respective piezo films 14, 16, 15 and 17. Furthermore, the star-up time of a resonator can be made shorter. Power consumption for driving a resonator can also be saved.

As illustrated in FIG. 1 and FIG. 2, respective areas of first piezo films 14, 16 and second piezo films 15, 17 are larger than third electrodes 18, 20 and fourth electrodes 19, 21. Respective areas of first electrodes 10, 12 and second electrodes 11, 13 are larger than first piezo films 14, 16 and second piezo films 15, 17. Therefore, even if there is dislocation in the patterning of either one among third electrodes 18, 20 and fourth electrodes 19, 21, or first piezo films 14, 16 and second piezo films 15, 17, a possible short-circuit between each of third electrodes 18, 20 and each of first electrodes 10, 12, or between each of fourth electrodes 19, 21 and each of second electrodes 11, 13 can be avoided.

The above description is based on the structure as shown in FIG. 1 and FIG. 2, namely, first electrodes 10, 12, second electrodes 11, 13, first piezo films 14, 16 and second piezo films 15, 17 are exposed.

Circumference areas of first electrodes 10, 12, second electrodes 11, 13, first piezo films 14, 16 and second piezo films 15, 17 may be covered with an insulating film of polyimide, etc. By so doing, even if there is a substantial dislocation in the patterning of either one among third electrodes 18, 20 and fourth electrodes 19, 21, or first piezo films 14, 16 and second piezo films 15, 17, a possible short-circuit between each of third electrodes 18, 20 and each of first electrodes 10, 12, or between each of fourth electrodes 19, 21 and each of second electrodes 11, 13 can be avoided.

A tuning fork structure in the present embodiment 1 is formed with Si material. This is because Si material has high mechanical strength, and the tuning fork can resonate with great amplitude; moreover, the material can be processed easily at high precision by the established semiconductor processing technologies.

The tuning fork structure may be formed with other non-piezoelectric material, such as diamond, fused quartz, alumina, GaAs, etc.

Each of first electrodes 10, 12 and second electrodes 11, 13 in the present embodiment 1 includes a Ti film at the bottom and a Pt—Ti film above it. The Ti film has a superior adhesive property with both Si and Pt—Ti films; therefore, it sticks firmly to main surface 5, which is made of Si, and to the Pt—Ti films.

On the Pt—Ti film, first and second piezo films 14, 16, 15 and 17 made of rhombohedral crystalline PZT having the (001) crystal plane in parallel with main surface 5 of arms 2, 3, or tetragonal crystalline PZT having the (111) crystal plane in parallel, can be formed favorably. Therefore, resonator 1 can be accomplished with small hysteresis.

For the upper structure of first electrodes 10, 12 and second electrodes 11, 13, a film of Ir—Ti, etc. may be used instead.

The above described are just exemplary, there may be other choices for the structure.

Material for the piezo film in the present embodiment 1 has been described based on PZT. Instead, a material of PZT system in which at least one item among the group of Mg, Nb and Mn is added to PZT may be used for piezo film.

Since the PZT and the PZT system material are provided with high piezo coefficients, the electro/mechanical conversion efficiency is improved.

The piezo films can be formed by, besides sputtering process, deposition, sol-gel technique, laser beam abrasion, hydrothermal synthesis or CVD.

Each one of first piezo films 14, 16 and second piezo films 15, 17, and first electrodes 10, 12 and second electrodes 11, 13, which have been formed respectively underneath third electrodes 18, 20 and fourth electrodes 19, 21, is disposed with a separation in between. As the results, the component of electric field irrelevant to driving is reduced and the stretching/shrinking of piezo films is not disturbed, to an improved drive efficiency of resonator 1.

Furthermore, the first, second, third and fourth electrodes and the first and second piezo films are formed on only one main surface 5 of tuning fork resonator 1, as shown in FIG. 1. Therefore, resonator 1 can be manufactured through simple manufacturing processes and fits to volume production.

Main surface 5 of a tuning fork in the present embodiment uses the (110) crystal plane of Si wafer.

Instead, the (100) crystal plane of Si wafer may be used. When a variation of stiffness is considered with respect to the direction by supposing that the <010> direction, at which the rotation angle is zero degree, as the origin, the wafer exhibits small stiffness variation against angular shift at directions <010>, <011> or <001>.

Therefore, resonator may be made using (010) crystal plane, (011) crystal plane or (001) crystal plane of the (100) crystal plane wafer disposed to be perpendicular to the direction of resonance (X direction). The resonators thus manufactured will exhibit small stiffness variation against angular shift, and small dispersion in the intrinsic tuning fork resonance frequency.

Since stiffness of Si is high at the <011> direction, resonators of high intrinsic resonance frequency are implemented when the direction coincides with resonance direction.

(Embodiment 2)

Figure 8:
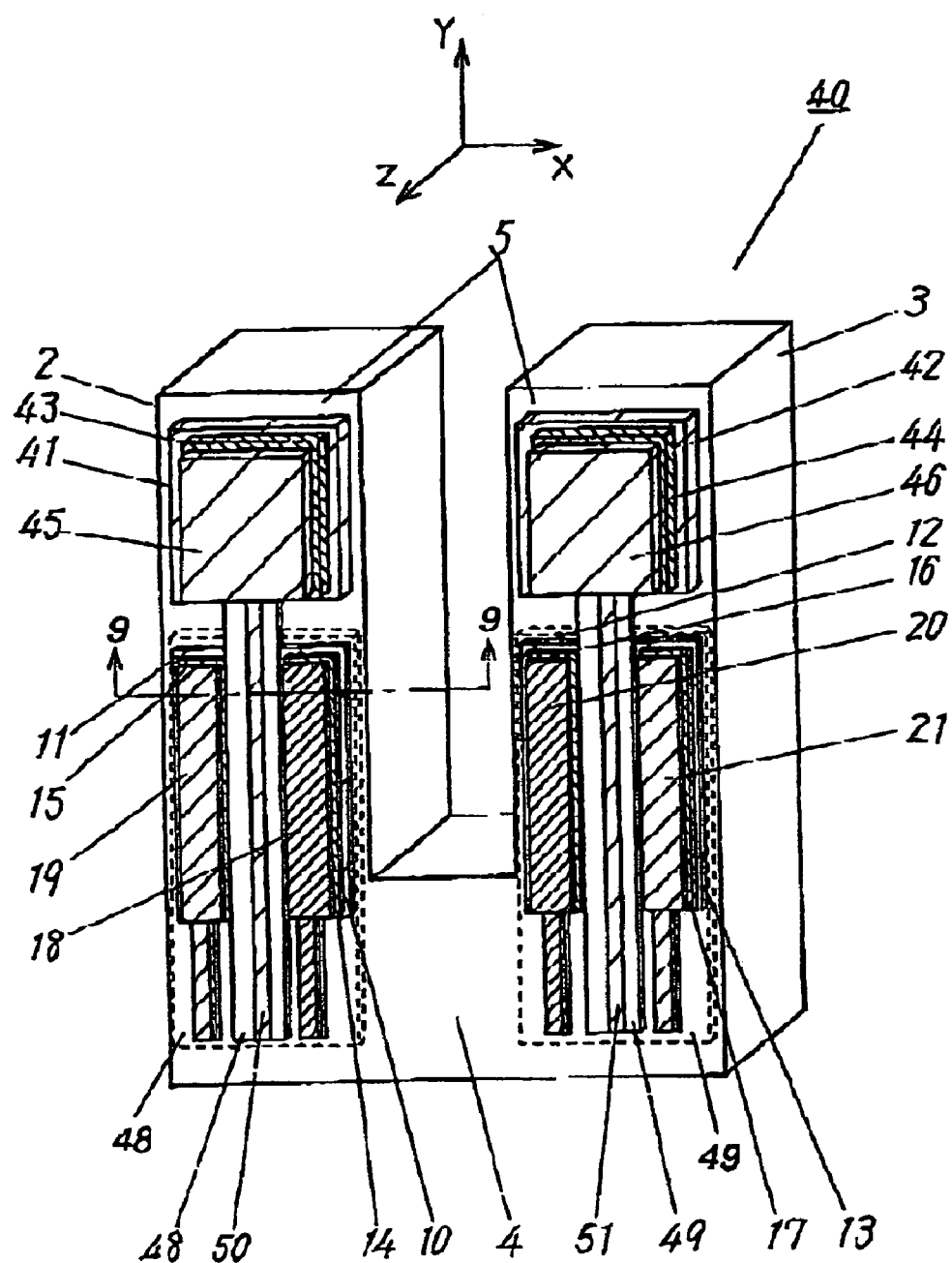
FIG. 8 shows a perspective view of a thin film micromechanical resonator gyro in accordance with a second exemplary embodiment of the present invention.

FIG. 8 is a perspective view showing a thin film micromechanical resonator gyro in accordance with a second exemplary embodiment of the present invention.

Figure 9:
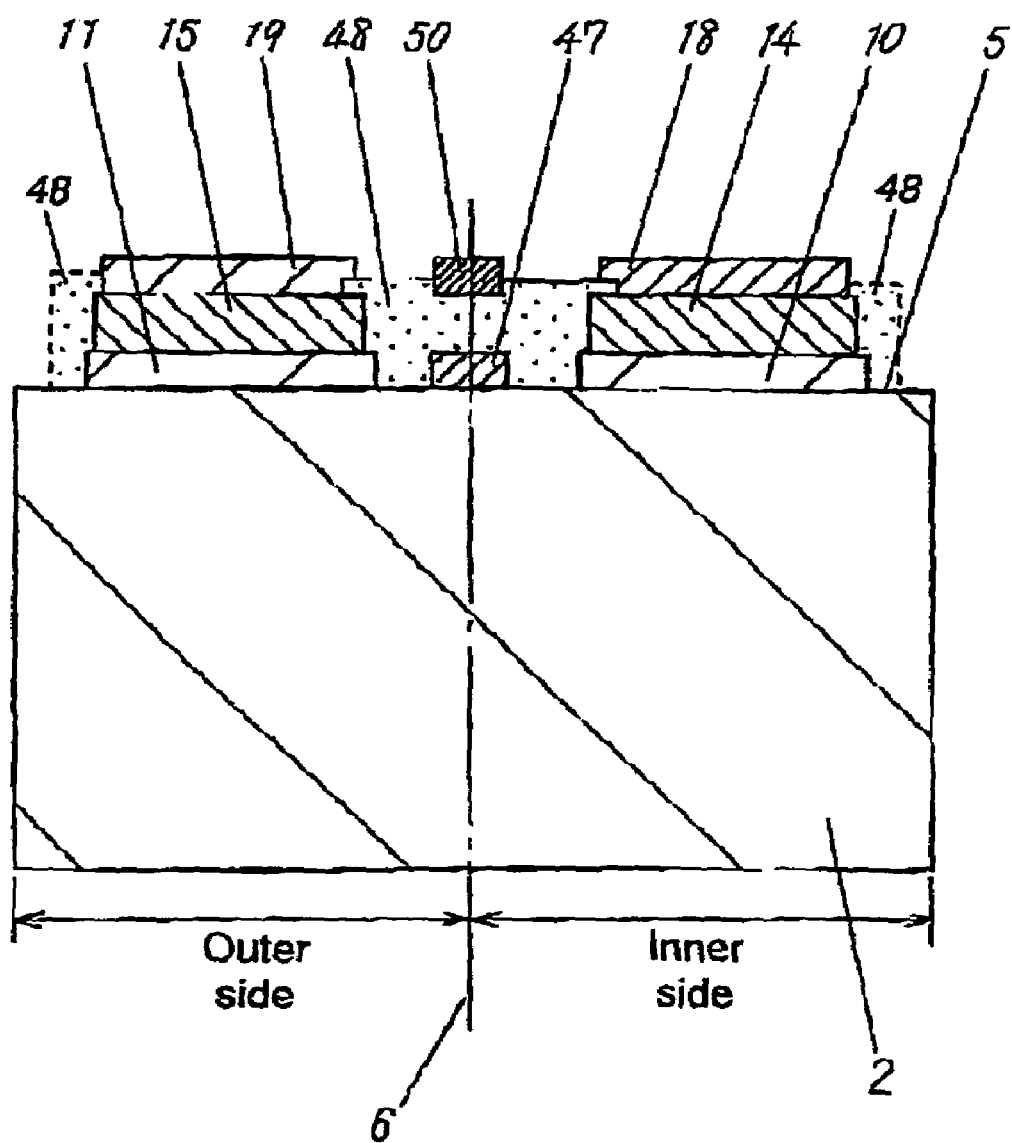
FIG. 9 is a cross sectional view of the resonator gyro in embodiment 2, showing the arm sectioned along the line 9—9.

FIG. 9 is a cross sectional view showing an arm of the resonator gyro sectioned along the line 9—9.

Those constituent portions in the present embodiment 2 which are identical to those of embodiment 1 are represented by providing the same numeral symbols, and detailed description of which portions are eliminated. Here, only the points specific to the present embodiment are described in detail.

Overall aspect of thin film micromechanical resonator gyro 40 (hereinafter referred to as resonator gyro) is shown in FIG. 8 and FIG. 9.

Resonator gyro 40 is provided with a sensing section disposed on main surface 5 of Si arms 2, 3 in a place from substantially the middle to the end part of arm, for detecting a given angular velocity.

The sensing section on arm 2 includes fifth electrode 41, third piezo film 43 and sixth electrode 45 disposed on main surface 5 of arm 2. The sensing section on arm 3 includes fifth electrode 42, third piezo film 44 and sixth electrode 46 disposed on main surface 5 of arm 3.

The third piezo film is disposed on the fifth electrode, the sixth electrode is disposed on the third piezo film.

Like first electrodes 10, 12 and second electrodes 11, 13, as shown in FIG. 16, fifth electrodes 41, 42 are formed of a layer of Ti 202 of about 100 Å thick as the lower part and a layer of Pt—Ti or the like material 204 of about 4000 Å thick as the upper part.

A PLMT layer of about 200 Å thick is provided between the layer of Pt—Ti, etc. 204 forming the upper part of fifth electrode and the third piezo film of PZT, etc.

Like the case with third electrodes 18, 20 and fourth electrodes 19, 21, as shown in FIG. 16, sixth electrodes 45, 46 are formed of a layer of Ti 206 of about 25 Å thick as the lower part and a layer of Au, etc. 208 of about 3000 Å thick as the upper part.

First lead out electrode 47 is formed, like fifth electrode 41, of a layer of Ti 202 of about 100 Å thick as the lower part and a layer of Pt—Ti or the like material 204 of about 4000 Å thick as the upper part.

First lead out electrode 47 is formed, like fifth electrode 41, of a layer of Ti of about 100 Å thick as the lower part and a layer of Pt—Ti or the like material of about 4000 Å thick as the upper part.

Insulation layer 48 formed of polyimide or the like material is provided to cover first lead out electrode 47, and fills gaps formed by first electrode 10 and second electrode 11 and by first piezo film 14 and second piezo film 15.

On insulation layer 48, second lead out electrode 50 is provided, so that it includes center line 6 and separated from third electrode 18 and fourth electrode 19. The lead out electrode 50 is connected with sixth electrode 45.

Like the case with sixth electrode 45, second lead out electrode 50 is formed of a layer of Ti 202 of about 25 Å thick as the lower part and a layer of Au, etc. 204 of about 3000 Å thick as the upper part.

First lead out electrode is provided on main surface 5 of arm 3, so that it includes center line 7 (not shown) and separated from first and second electrodes 12, 13. The first lead out electrode is connected with fifth electrode 42. Above the first lead out electrode, insulation layer 49 is provided in the same structure as insulation layer 48.

On insulation layer 49, second lead out electrode 51 is provided, so that it includes center line 7 (not shown) and separated from third and fourth electrodes 20, 21. Second lead out electrode 51 is connected with sixth electrode 46.

Also in the present embodiment 2, respective areas of first piezo films 14, 16 and second piezo films 15, 17 are larger than third electrodes 18, 20 and fourth electrodes 19, 21, as shown in FIG. 8 and FIG. 9. Respective first electrodes 10, 12 and second electrodes 11, 13 have larger areas than those of first piezo films 14, 16 and second piezo films 15, 17.

Consequently, even if there is a dislocation in the patterning of either third electrodes and fourth electrodes or first piezo films and second piezo films, a possible short-circuit trouble between first electrodes and third electrodes or between second electrodes and fourth electrodes can be avoided.

Third piezo film has larger area than that of sixth electrode. Fifth electrode has larger area than that of third piezo film. Consequently, even if there is a dislocation in the patterning with respect to sixth electrode or third piezo film, a possible short-circuit trouble between sixth electrode and fifth electrode can be avoided.

In FIG. 8 and FIG. 9, insulation layers 48, 49 fill gaps formed by first electrode and second electrode and by first piezo film and second piezo film.

It is preferred to cover the entire circumference portion including the whole side face of first electrode and second electrode, and the entire circumference portion including the whole side face of first piezo film and second piezo film with insulating layer 48, 49, as shown in FIG. 8 and FIG. 9.

It is more preferred to cover the entire circumference portion including the whole side face of fifth electrode, and the entire circumference portion including the whole side face of third piezo film with an insulating layer.

By so doing, even if there is a substantial dislocation in the patterning with respect to either one of third electrode, fourth electrode, sixth electrode, first piezo film, second piezo film and third piezo film, a possible short-circuit trouble between first electrode and third electrode, between second electrode and fourth electrode and between fifth electrode and sixth electrode can be avoided.

Resonator gyro 40 measures; overall width 1 mm, overall length 5 mm, and total thickness about 0.2 mm; resonance frequency at primary mode f in driving direction (X direction) is 17 kHz, as described in embodiment 1. Primary mode resonance frequency f in the direction of detection (Z direction), which is perpendicular to main surface 5, is 16 kHz.

Principle of detecting the angular velocity is described in the below.

As described earlier in embodiment 1, when an angular velocity around Y axis is given to arms 2, 3, which are resonating in X direction at f=17 kHz, arms 2, 3 are bent opposite to each other in Z axis direction due to Coriolis force. As the result, third piezo films 43, 44 disposed on arms 2, 3, respectively, generate electric charges opposite to each other. Sixth electrodes 45, 46 detect the opposite electric charges to obtain outputs proportional to the given angular velocity.

As described in embodiment 1, the first electrode and first piezo film are separated from the second electrode and second piezo film, with the arm center line in between. As the result, the component of electric field irrelevant to the driving is reduced. Furthermore, the stretching/shrinking of piezo films is hardly disturbed. Thus, the driving efficiency in resonator gyro 40 is raised, and the sensitivity of detecting a given angular velocity is improved.

The first piezo film and second piezo film for driving are also separated from the third piezo film for sensing. Therefore, components of capacitance coupling generated between respective third and fourth electrodes and the sixth electrode are reduced.

Therefore, resonator gyro 40 can output the results of detecting given angular velocity in a stable manner. For example, it outputs detection results which are least affected by varying temperature.

Like in embodiment 1, the following statements also apply to embodiment 2.

Namely, the first and second electrodes are assumed to be the GND electrode, or the virtual GND electrode, and an alternating voltage is applied to third electrode at the same phase, while to the fourth electrode at the phase that is opposite to that applied to the third electrode.

Instead, the alternating voltage may be applied to respective electrodes; to the first and fourth electrodes at the same phase, and to the second and third electrodes at the same phase, while to the first and the second electrodes at the opposite phases each other. With this arrangement, a greater driving electric field can be applied to respective piezo films 14, 16, 15 and 17. Therefore, resonator gyro 40 is provided with a higher drive efficiency, and the sensitivity of detecting a given angular velocity is further improved. Also, the star-up time is shortened, and it can be driven with lower power consumption.

Like in embodiment 1, the third and fourth electrodes, and the first and second piezo films are disposed to be symmetric to each other with respect to the arm's center line. Therefore, in resonator gyro 40, the vibration hardly deviates from a certain specific direction of vibration (X direction). Thus, it delivers the results of detecting a given angular velocity at higher sensitivity and with higher grade.

The third piezo film is separated from respective first and second piezo films. Furthermore, the sixth electrode is separated from respective third and fourth electrodes. Therefore, the components of capacitance coupling generated between the sixth electrode and respective third and fourth electrodes are reduced. Thus, resonator gyro 40 can output stable detection results to a given angular velocity.

Each of the first and second electrodes, each of the third and fourth electrodes, and each of the first and second piezo films is disposed to be symmetric to each other with respect to the arm's center line. Furthermore, the fifth and sixth electrodes, the first and second lead out electrodes, and third piezo films 43, 44 are disposed respectively to be symmetric with respect to the arm's center line.

Therefore, the capacitance coupling components generated between the sixth electrode and respective third and fourth electrodes, and those between the second lead out electrode and respective third and fourth electrodes, are cancelled. Furthermore, electric charges generated with respect to the sixth electrode during drive vibration in X direction is also cancelled.

Thus, resonator gyro 40 is accomplished as a gyro with a very high precision.

The present embodiment 2 has been described based on a system where a given angular velocity is detected by means of piezoelectricity.

Besides the above means, it can be detected by making use of the resistance effects, the electrostatic capacitance effects, an optical pick-up, etc.

(Embodiment 3)

Figure 10A:
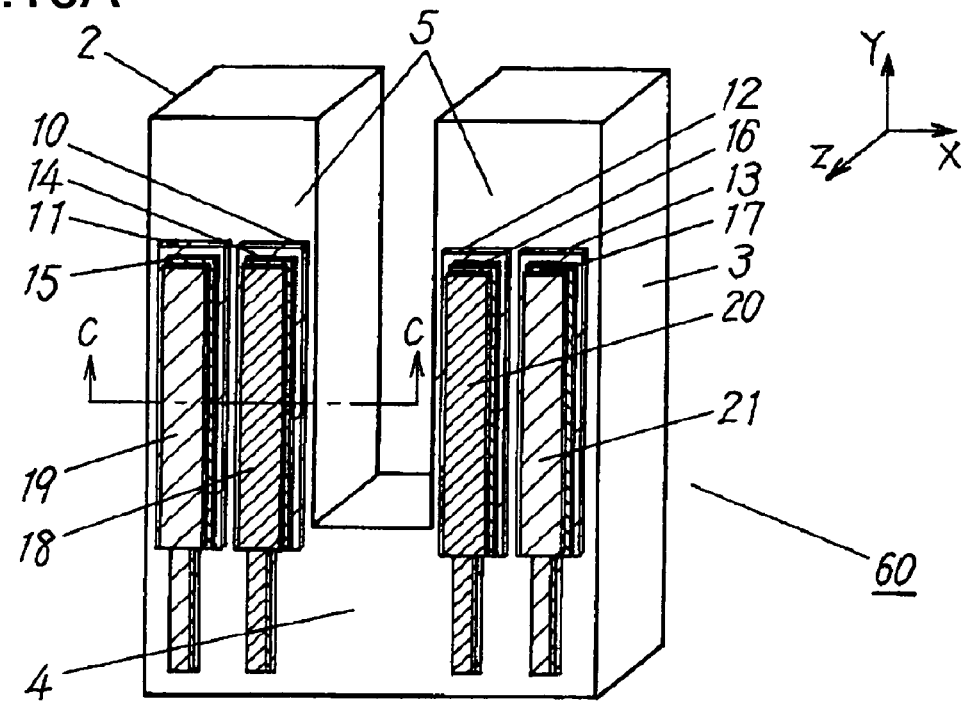
FIG. 10A is a perspective view of a thin film micromechanical resonator gyro in accordance with a third exemplary embodiment of the present invention, as viewed from a main surface side.
Figure 10B:
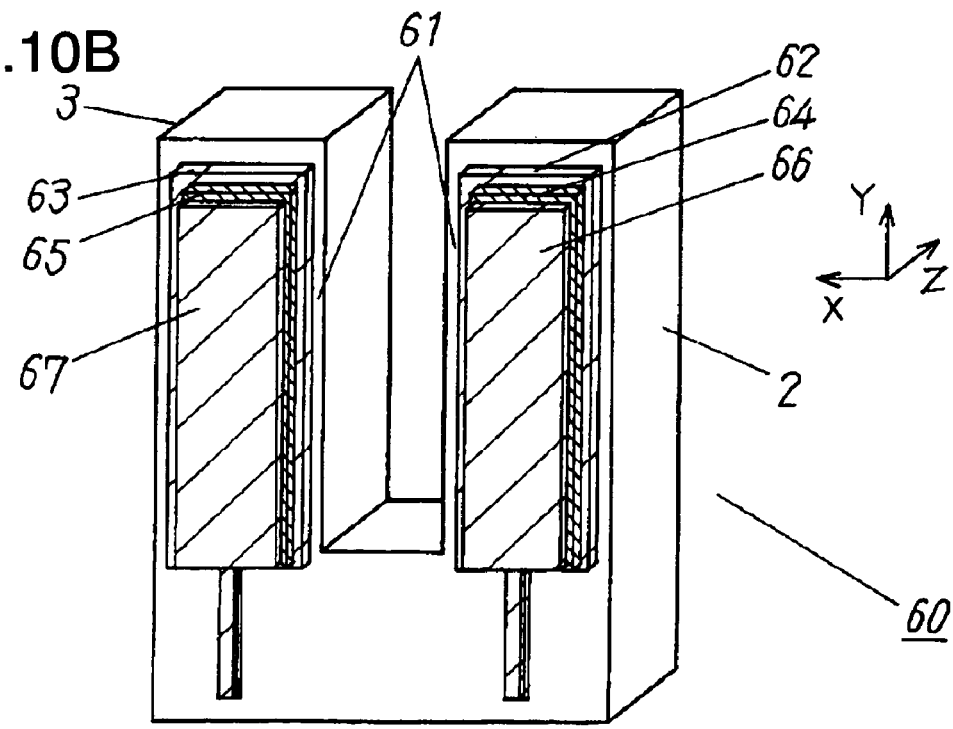
FIG. 10B is a perspective view of the resonator gyro in embodiment 3, as viewed from other main surface side.
Figure 11:
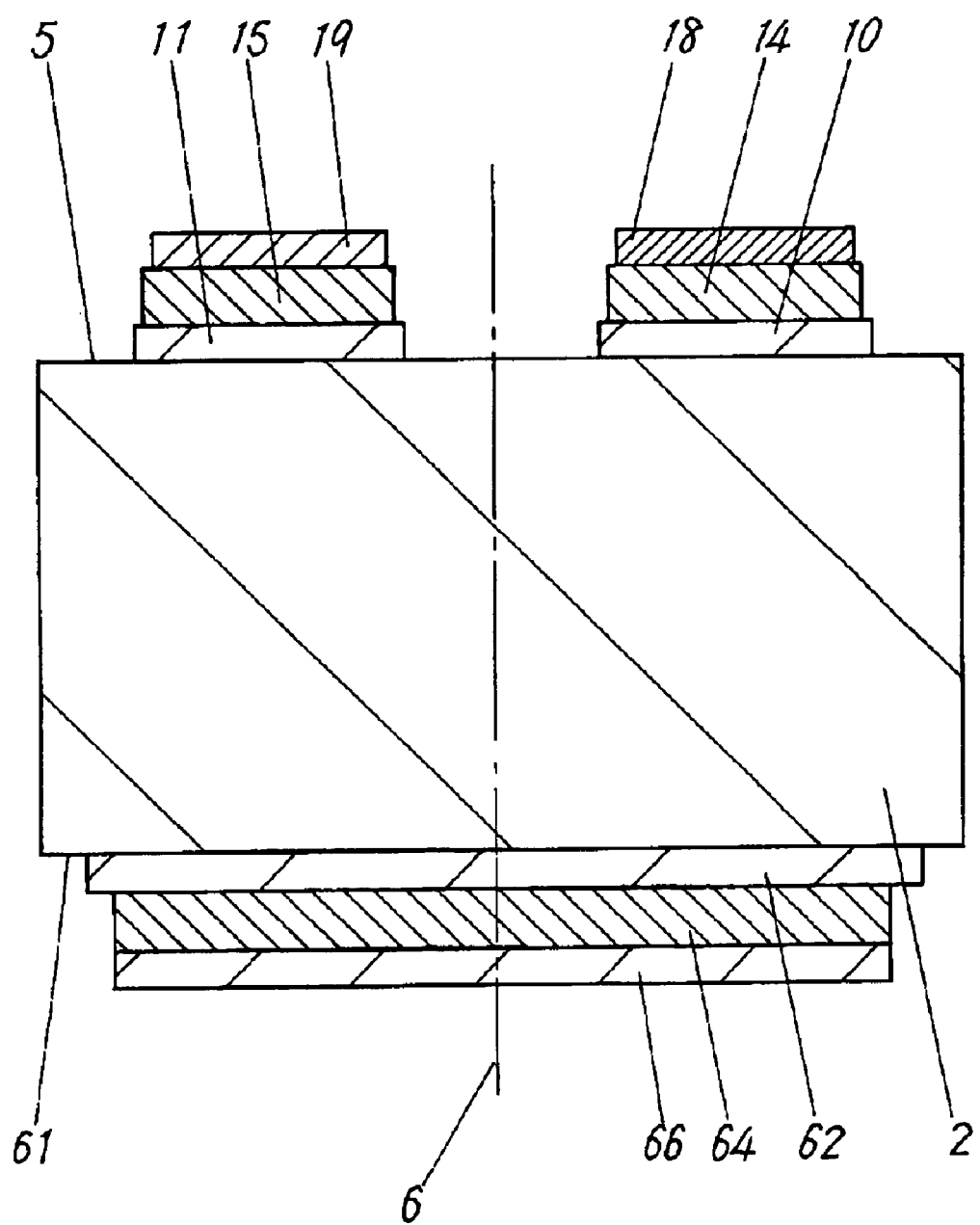
FIG. 11 is a cross sectional view of the resonator gyro in embodiment 3, showing the arm sectioned along the line 11—11.

FIG. 10A is a perspective view showing a resonator gyro in accordance with the present embodiment 3 as viewed from on a main surface. FIG. 10B is that as viewed from other main surface. FIG. 11 is a cross sectional view of an arm of the resonator gyro, sectioned along the line 11—11.

Those constituent portions in the present embodiment 3 which are identical to those of embodiments 1 and 2 are represented by providing the same reference numerals, and detailed description of which portions are eliminated. Here, only the points specific to the present embodiment are described in detail.

Referring to FIG. 10 and FIG. 11, resonator gyro 60 has one main surface 5 and other main surface 61 opposing to main surface 5.

Fifth electrodes 62, 63 are disposed on main surface 61 of arms 2, 3, respectively. Third piezo films 64, 65 are disposed on fifth electrodes 62, 63, respectively. Sixth electrodes 66, 67 are disposed on third piezo films 64, 65, respectively.

The sensing section at arm 2 includes fifth electrode 62, third piezo film 64 and sixth electrode 66.

The sensing section at arm 3 includes fifth electrode 63, third piezo film 65 and sixth electrode 67.

The materials and processes for providing fifth electrodes 62, 63, third piezo films 64, 65 and sixth electrodes 66, 67 are basically the same as those described in earlier embodiments 1 and 2.

Also in the present embodiment 3, respective areas of the first piezo film and the second piezo film are larger than those of the third electrode and the fourth electrode, as shown in FIG. 10 and FIG. 11.

Respective areas of the first electrode and second electrode are larger than those of the first piezo film and the second piezo film, too.

Consequently, even if there is a dislocation in the patterning with respect to either one among the third electrode, fourth electrode, first piezo film and second piezo film, a possible short-circuit between the third electrode and first electrode and between the fourth electrode and second electrode can be avoided.

Respective areas of third piezo films 64, 65 are larger than those of sixth electrodes 66, 67. Respective areas of fifth electrodes 62, 63 are larger than those of third piezo films 64, 65. Consequently, even if there is a dislocation in the patterning with respect to either one of the sixth electrode and third piezo film, a possible short-circuit between the sixth electrode and fifth electrode can be avoided.

The drive section in the present embodiment 3 shown in FIG. 10A is disposed at the same place as that in FIG. 8.

The sensing section shown in FIG. 10B is provided on main surface 61 of arms 2, 3 formed of Si material, and the sensing section spreads covering the whole region from the end part of the arm to the vicinity of stem 4.

The reasons why it is structured as above are as follows.

The sensing section is hardly affected by the admittance characteristic of resonance frequency in the drive direction (X direction). The drive section is not located in the same position as the sensing section. Therefore, the sensing section can include the neighboring area of stem 4, where the distortion due to Coriolis force is the highest in arms 2, 3. Thus, the sensing area of the sensing section can be enlarged.

In the above descriptions, the sensing section has been formed covering the whole area at both of arms 2 and 3.

Instead, the sensing section may be provided on at least either one of main surfaces 61, covering an area from substantially its middle part to the vicinity of stem 4.

In the present embodiment 3, both the drive section and the sensing section are provided on both of main surfaces 5 and 61 at arms 2, 3, covering the middle part towards the vicinity of stem 4. Therefore, the accuracy of detection output to a given angular velocity is improved. Furthermore, the sensitivity of detection is also improved.

In the same manner as described in embodiments 1 and 2, each of the first and second electrodes, and the first and second piezo films, is separated to each other with the arm center line in between. As the result, the component of electric field irrelevant to the driving is reduced, and the stretching/shrinking of piezo film is hardly disturbed.

Thus, the drive efficiency in resonator gyro 60 is raised, and the detection sensitivity to a given angular velocity is improved.

Also, the first and second piezo films for driving are separated from third piezo films 64, 65 for sensing. Therefore, the capacitance coupling component between the third and fourth electrodes and sixth electrodes 66, 67 is reduced. As a result, the detection output to a given angular velocity is stable also with resonator gyro 60. For example, the detection output has a good stability against varying temperature.

In the same way as in embodiments 1 and 2, the first and second electrodes are assumed to be the GND electrode, or the virtual GND electrode, and the third electrode is provided with an alternating voltage at the same phase, while the fourth electrode at the phase that is opposite to third electrode.

The alternating voltage may be applied instead, so that the first and fourth electrodes at the same phase, and the second and third electrodes at the same phase, while the first and the second electrodes at the opposite phases. Under the above arrangement, a greater electric field can be provided for driving respective piezo films. Thus, the driving efficiency is raised also in resonator gyro 60, and the detection sensitivity to a given angular velocity is further improved. Furthermore, in resonator gyro 60, the star-up time is reduced, and it can be operated at lower power consumption.

In the same way as in embodiments 1 and 2, the third and fourth electrodes, and the first and second piezo films, are disposed to be symmetric to the arm center line, also in the present embodiment. Therefore, in resonator gyro 60, the vibration hardly deviates from a certain specific direction of vibration (X direction). Thus, it generates the quality detection outputs higher in the sensitivity to a given angular velocity.

In the present embodiment 3, third piezo films 64, 65 are separated from the first and second piezo films. Sixth electrodes 66, 67 are separated from the third and fourth electrodes. Therefore, the capacitance coupling components between the sixth electrode and each of third and fourth electrodes are reduced. Thus, a stable detection output is made available to a given angular velocity.

(Embodiment 4)

Figure 12:
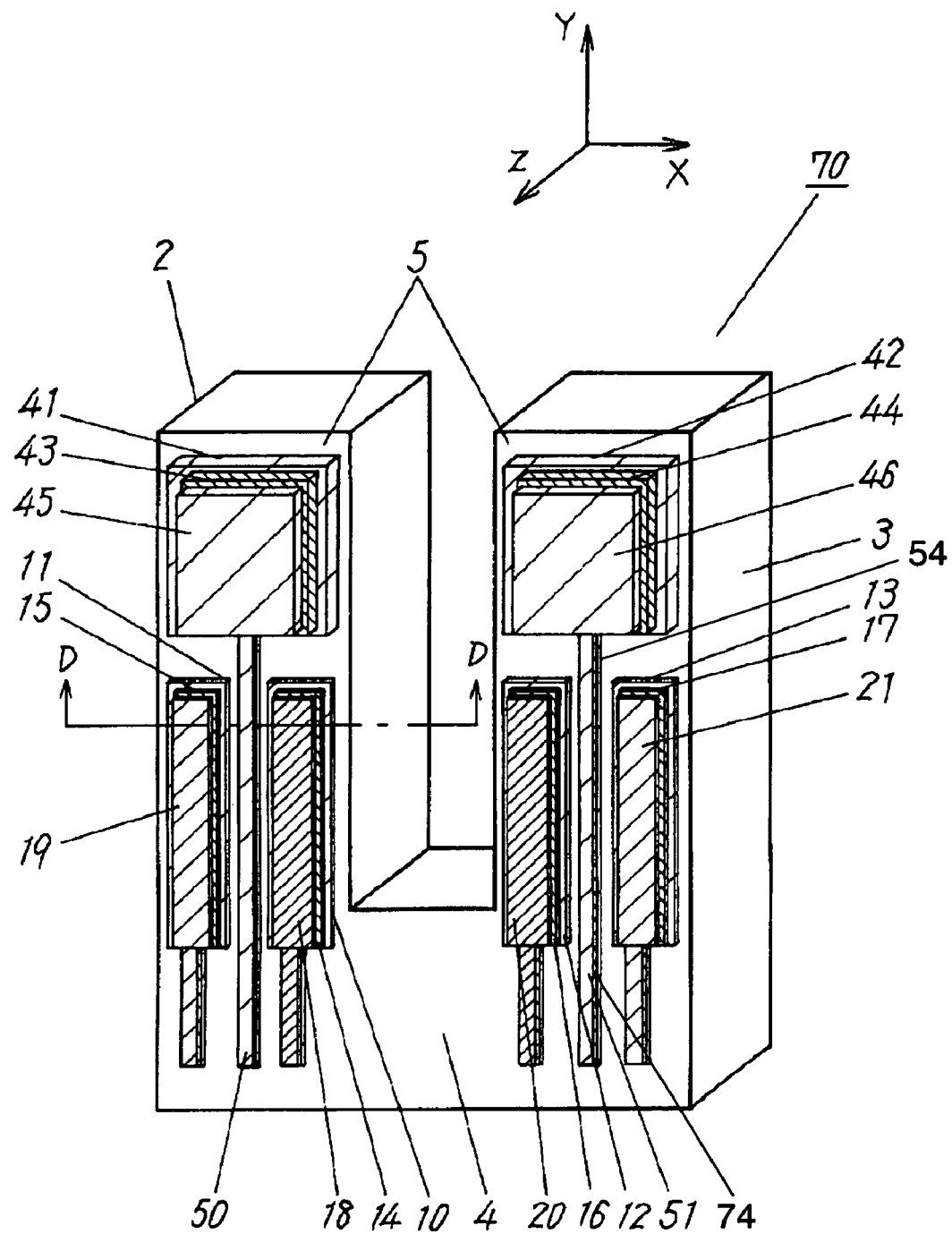
FIG. 12 shows a perspective view of a thin film micromechanical resonator gyro in accordance with a fourth exemplary embodiment of the present invention.

FIG. 12 is a perspective view showing a resonator gyro in accordance with a fourth exemplary embodiment.

Figure 13:
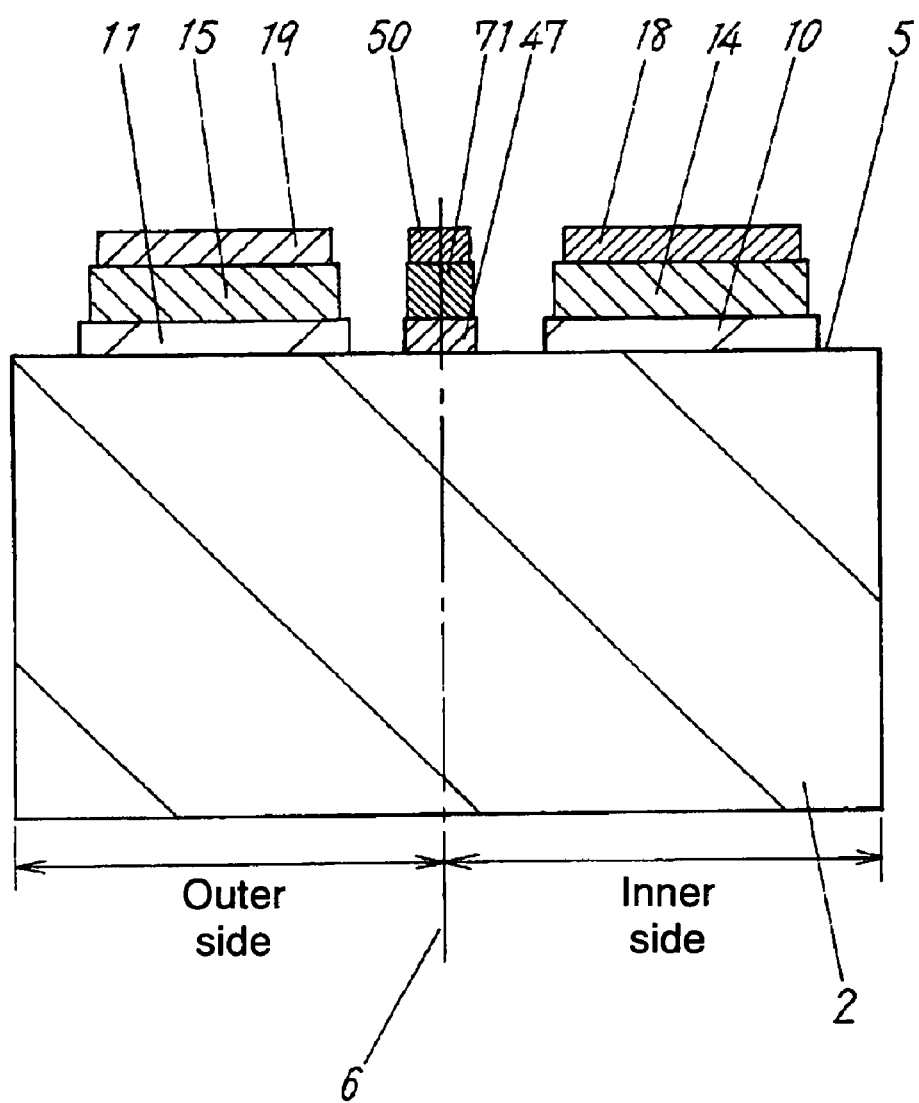
FIG. 13 is a cross sectional view of the resonator gyro in embodiment 4, showing the arm sectioned along the line 13—13.
Figure 14:
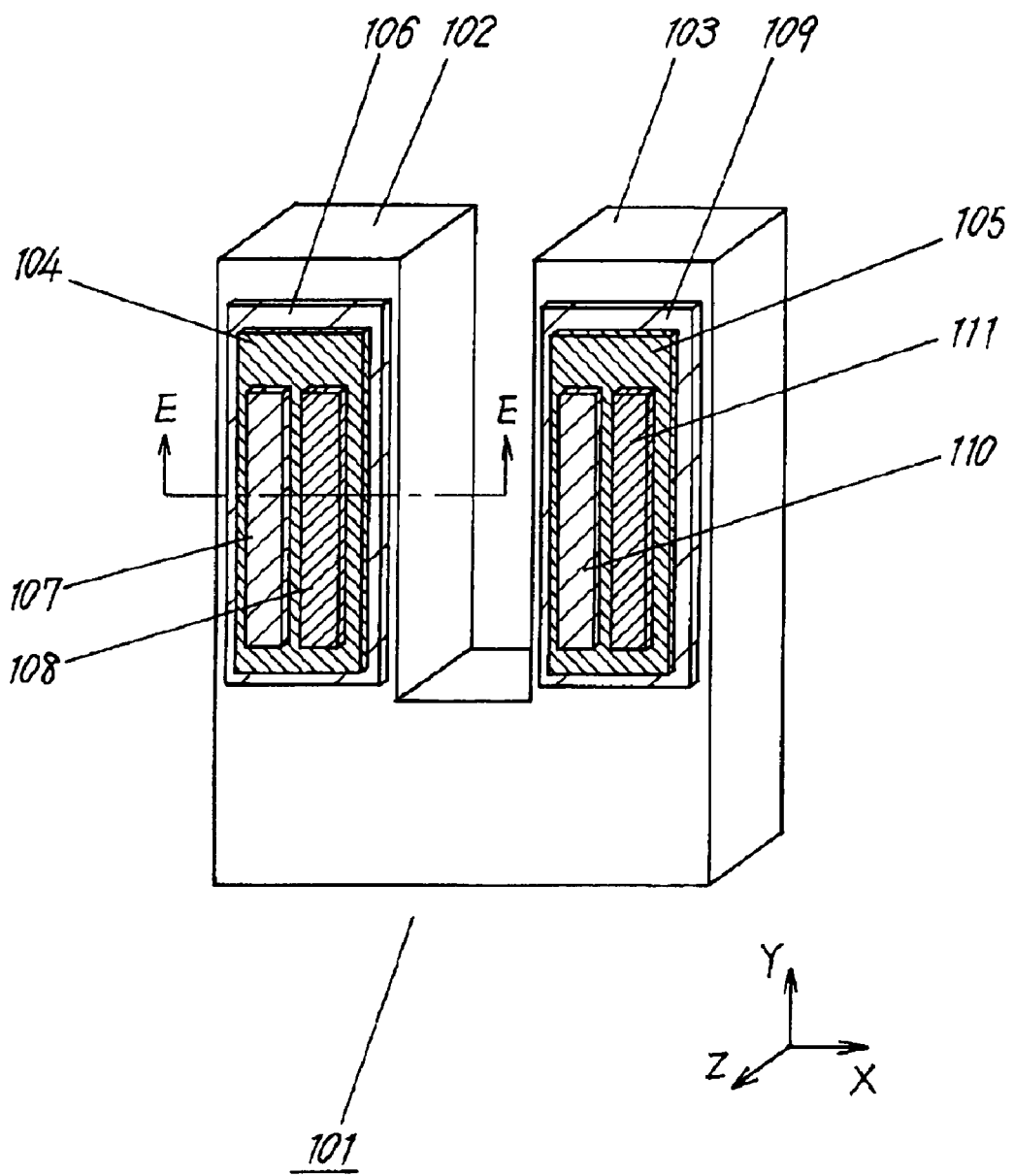
FIG. 14 is a perspective view of a conventional thin film micromechanical resonator gyro.
Figure 15:
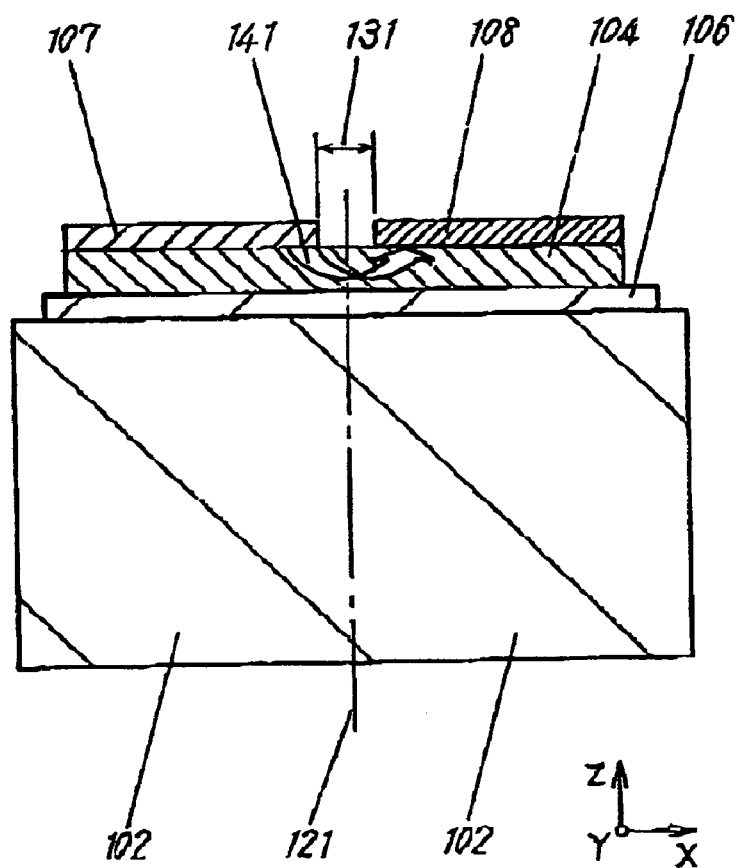
FIG. 15 is a cross sectional view of a conventional thin film micromechanical resonator gyro, showing the drive section sectioned along the line 15—15.

FIG. 13 is a cross sectional view of an arm of the resonator gyro, sectioned along the line 13—13.

Those constituent portions in the present embodiment 4 which are identical to those of embodiments 1, 2 and 3 are represented by providing the same reference numerals, and detailed description of which portions are eliminated. Here, only the points specific to the present embodiment are described in detail.

In FIG. 12 and FIG. 13, fourth piezo film 71 of resonator gyro 70 includes the fourth piezo film as insulating layer.

Materials and processes for providing fourth piezo film 71 are basically the same as those described in the earlier embodiments 1, 2 and 3.

First lead out electrode 47 is provided on main surface 5 of arm 2 to include center line 6, and separated from first electrode 10 and second electrode 11.

First lead out electrode 47 is connected with fifth electrode 41. On first lead out electrode 47, fourth piezo film 71 is provided via a PLMT film of about 200 Å thick.

Fourth piezo film 71 is formed of a layer of PZT, etc. having the same thickness as first, second and third piezo films 14, 15 and 43.

Fourth piezo film 71 is connected with third piezo film 43. On fourth piezo film 71, second lead out electrode 50 is provided.

Also provided on main surface 5 of arm 3 are fourth piezo film 74 and second lead out electrode 51 disposed on first lead out electrode 54, in the same structure as those on main surface 5 of arm 2.

Provided between first lead out electrodes 47, 54 and second lead out electrodes 50, 51, respectively, are fourth piezo films 71, 72 disposed as insulating layer. This is advantageous in improving the manufacturing productivity in volume production.

In the same way as in embodiments 1, 2 and 3, each of the first electrode and second electrode, and the first piezo film and second piezo film, in the present embodiment 4 is separated to each other, with the arm center line in between.

Thus, the component of electric field irrelevant to the driving is reduced, and the stretching/shrinking of piezo film is hardly disturbed.

Thus, the driving efficiency in resonator gyro 70 is raised, and the sensitivity of detecting a given angular velocity is improved.

Also, each of first piezo films 14, 16 and second piezo films 15, 17 for driving, and third piezo films 43, 44 for sensing is separated from each other. Therefore, the components of capacitance coupling between third electrode 18, fourth electrode 19 and sixth electrode 45, and between third electrode 20, fourth electrode 21 and sixth electrode 46, are reduced. As a result, resonator gyro 70 provides stable detection output to a given angular velocity. For example, the detection output has a good stability against varying temperature.

In the same way as in embodiments 1, 2 and 3, the first and second electrodes are assumed to be the GND electrode, or the virtual GND electrode. The third electrode is provided with an alternating voltage at the same phase, while the fourth electrode at the phase opposite to third electrode.

Instead, an alternating voltage may be applied to the first and fourth electrodes at the same phase, and the second and third electrodes at the same phase, while the first and the second electrodes at the phases opposite to each other. Under the above arrangement, respective piezo films 14, 16, 15 and 17 can be provided with a greater drive electric field.

Thus, the driving efficiency is further raised, and the detection sensitivity to a given angular velocity is more improved. Furthermore, the star-up time is reduced, and it can be operated at lower power consumption.

Like in embodiments 1, 2 and 3, respective third and fourth electrodes, and the first and second piezo films in the present embodiment 4 are disposed to be symmetric to the arm center line.

Therefore, the vibration in resonator gyro 70 hardly deviates from a certain direction of vibration (X direction). Therefore, the detection output to a given angular velocity hardly contains a noise. Thus, it outputs quality detection results at high sensitivity.

In the present embodiment 4, the third piezo film is separated from the first and second piezo films, and the sixth electrode from the third and fourth electrodes. Therefore, the capacitance coupling components among sixth electrode 45, third electrode 18 and fourth electrode 19, and among sixth electrode 46, third electrode 20 and fourth electrode 21 are reduced. Thus, a stable detection output is provided to a given angular velocity.

Furthermore, respective first electrode and the second electrode, the third electrode and the fourth electrode, and the first piezo film and the second piezo film are disposed symmetric to each other with respect to the arm center line.

Still further, the fifth and sixth electrodes, the first and second lead out electrodes, and the third piezo film are also disposed to be symmetric to the arm center line.

Therefore, the capacitance coupling components among the third, fourth electrodes and sixth electrode, and those among the third, fourth electrodes and the second lead out electrode can be cancelled. Furthermore, electric charges generated during the drive vibration to X direction at sixth electrodes 45, 46 can be cancelled. Thus, resonator gyro 70 of very high precision level is obtained.

Also in the present embodiment 4, respective areas of the first piezo film and second piezo film are larger than those of the third electrode and fourth electrode, as shown in FIG. 12 and FIG. 13. Further, areas of the first electrode and second electrode are larger than those of the first piezo film and second piezo film.

Consequently, even if there is a dislocation in the patterning with respect to either one among the third electrode, fourth electrode, first piezo film and second piezo film, a possible short-circuit between the third electrode and first electrode, or between the fourth electrode and second electrode, can be avoided.

Areas of third piezo films 43, 44 are larger by one scale than those of sixth electrodes 45, 46. Furthermore, areas of fifth electrodes 41, 42 are larger by one scale than those of third piezo films 43, 44. Consequently, even if there is a dislocation in the patterning with respect to either one among sixth electrodes 45, 46 and third piezo films 43, 44, a possible short-circuit between the sixth electrode and the fifth electrode can be avoided.

Respective areas of fourth piezo films 71, 72 are larger than those of second lead out electrodes 50, 51. Areas of first lead out electrodes 47, 48 are larger than those of fourth piezo films 71, 72. Consequently, even if there is a dislocation in the patterning with respect to either one among second lead out electrodes 50, 51 and fourth piezo films 71, 72, a possible short-circuit between the second lead out electrode and the first lead out electrode can be avoided.

The tuning fork structure of resonator gyros 40, 60 and 70 in embodiments 2, 3 and 4 are also formed of Si material. This is because Si material has a high mechanical strength, and it can be processed at high precision by making use of established semiconductor processing technologies. These resonator gyros make tuning fork resonance with large amplitude, so it detects a given angular velocity at high sensitivity.

The tuning fork structure may be formed instead with other non-piezoelectric material, such as diamond, fused quartz, alumina, GaAs, etc.

Like in embodiment 1, the piezo films in embodiments 2, 3 and 4 may be formed using a PZT system material, instead of PZT. As the piezoelectric coefficient is becoming higher, a piezo film exhibits the higher efficiency in the electro/mechanical conversion. In this case, it can detect a given angular velocity at high sensitivity.

Regarding the orientation of piezoelectric thin film, a rhombohedral crystalline structure having the (001) crystal plane on the main surface of arm, or a tetragonal crystalline structure having the (111) crystal plane on the main surface of arm, may be used like in embodiment 1. Thereby, all of the angles of a plurality of polarized vectors become equal with respect to the direction of drive electric field applied. As the result, it provides a stable detection output to a given angular velocity.

Descriptions in embodiments 2, 3 and 4 have been based on an example where the drive section is provided at both of arms 2 and 3. However, the drive section may be provided instead on at least one main surface of either one of the arms covering substantially the middle to the vicinity of stem portion.

Resonator gyros 40, 60 and 70 described in embodiments 2, 3 and 4 detect a given angular velocity precisely, and with high sensitivity. Therefore, a high accuracy navigation system can be implemented by making use of the output from the resonator gyro.

The yaw rate sensors and pitching sensors can make a good contribution to stable cruising of automobiles when the sensors make use of the output from the resonator gyro. When the output is used for the rolling sensors, it will enable precise control of airbag systems.

Besides the above described examples, the resonator gyros 40, 60 and 70 in the present invention have many applications in cameras and various other apparatus and systems.

INDUSTRIAL APPLICABILITY

The present invention offers a thin film micromechanical resonator, in which the component of electric field that does not contribute to driving is reduced and the stretching/shrinking of piezoelectric thin films is not disturbed. Thus, the resonator provides a high drive efficiency.

The present invention further offers a thin film micromechanical resonator gyro, in which the component of electric field that does not contribute to driving is reduced and the stretching/shrinking of piezoelectric films is hardly disturbed. Thus, the resonator gyro provides the high drive efficiency and a highly sensitive detection output to a given angular velocity.

Furthermore, in accordance with the present invention, the fourth piezoelectric thin film is used also for an insulating layer between the first lead out electrode and second lead out electrode. Therefore, when manufacturing thin film micromechanical resonator gyros in big volume, the production efficiency is improved a step further.

The invention claimed is:

1. A thin film micromechanical resonator gyro comprising
   (1) a tuning fork having at least two arms and at least one stem connecting said arms, formed of a non-piezoelectric material;
   (2) a drive section including
      (a) a first electrode provided on at least one main surface of at least one of said arms in a place inner than a center line of the main surface,
      (b) a second electrode provided on said at least one main surface in a place outer than the center line with a separation from said first electrode,
      (c) a first piezoelectric thin film provided on said first electrode,
      (d) a second piezoelectric thin film provided on said second electrode,
      (e) a third electrode provided on said first piezoelectric thin film, and
      (f) a fourth electrode provided on said second piezoelectric thin film; and
   (3) a sensing section provided on said at least one main surface of said at least one of arms, wherein
   said tuning fork resonates in the direction perpendicular to said center line (X direction) when an alternating voltage is applied to said third and fourth electrodes at opposite phases each other, and
   said sensing section detects flexion of said arm due to an angular velocity given thereto, caused in the direction perpendicular to said main surface (Z direction) in proportion to the Coriolis force, as an electrical or optical output, wherein
   said sensing section includes a fifth electrode disposed on said at least one main surface with a separation from said first and second electrodes, a third piezoelectric thin film provided on said fifth electrode, an a sixth electrode provided on said third piezoelectric thin film, wherein
   said fifth electrode is disposed in a place further to an end of said arm than said first and second electrodes,
   a first lead out electrode is provided between said first and second electrodes with a separation from the electrodes,
   said fifth electrode is connected with said first lead out electrode,
   at least circumference portions of said first and second electrodes and said first and second piezoelectric thin films, and said first lead out electrode are covered with an insulating layer,
   a second lead out electrode is provided between said third and fourth electrodes on said insulating layer with a separation from said third and fourth electrodes,
   said sixth electrode is connected with said second lead out electrode, and
   said first and second electrodes, said third and fourth electrodes, said fifth and sixth electrodes, said first and second lead out electrodes, said first and second piezoelectric thin films, and said third piezoelectric thin film are disposed substantially symmetric to said center line.

2. The thin film micromechanical resonator gyro of claim 1, wherein
   said first electrode and said second electrode, said third electrode and said fourth electrode, and said first piezoelectric thin film and said second piezoelectric thin film are disposed substantially symmetric, respectively, to each other to said center line.

3. The thin film micromechanical resonator gyro of claim 1, wherein
   said drive section is disposed on said at least one main surface of said at least one arm, in a place from substantially a middle portion of said at least one main surface to a vicinity of the stem.

4. The thin film micromechanical resonator gyro of claim 1, wherein
   said sensing section is disposed on said at least one of main surfaces of said at least one arm, in a place from a substantially middle of said at least one main surface to a vicinity of the stem.

5. The thin film micromechanical resonator gyro of claim 1, wherein
   an insulating layer is formed covering circumference portions of said first and second electrodes and said first and second piezoelectric thin films.

6. The thin film micromechanical resonator gyro of claim 1, wherein said tuning fork is formed of Si (silicon).

7. The thin film micromechanical resonator gyro of claim 6, wherein
   a (1-11) crystal plane or a (-111) crystal plane of a (110) crystal plane wafer of the Si is disposed perpendicular to said resonance direction (X direction).

8. The thin film micromechanical resonator gyro of claim 6, wherein
   a (010) crystal plane, a (011) crystal plane or a (001) crystal plane of a (100) crystal plane wafer of the Si is disposed perpendicular to said resonance direction (X direction).

9. The thin film micromechanical resonator gyro of claim 6, wherein
   each of said first, second and fifth electrodes includes a Ti layer disposed at a lower part thereof and a Pt—Ti layer disposed at an upper part thereof.

10. The thin film micromechanical resonator gyro of claim 9, wherein
    a layer of lead titanate added with lanthanum and magnesium (PLMT) is further provided between said Pt—Ti layer and said piezoelectric thin film.

11. The thin film micromechanical resonator gyro recited in claim 1, wherein
    said first, second and third piezoelectric thin films are formed of lead zirconate titanate (PZT), or a lead zirconate titanate (PZT) system added with at least one item among the group of Mg, Nb and Mn.

12. The thin film micromechanical resonator gyro of claim 11, wherein
said first, second and third piezoelectric thin films have a rhombohedral crystalline structure with a (001) crystal plane thereof in parallel with said at least one main surface, or a tetragonal crystalline structure with a (111) crystal plane thereof in parallel with said at least one main surface.

13. The thin film micromechanical resonator gyro of claim 1, wherein
each of said third, fourth and sixth electrodes includes a Ti layer disposed as the lower part and an Au layer disposed as the upper part.

14. The thin film micromechanical resonator gyro of claim 1, wherein
an alternating voltage is applied to said first and fourth electrodes at the same phase, to said second and third electrodes at the same phase, while to said first and second electrodes at opposite phases to each other.

15. The thin film micromechanical resonator gyro of claim 1, wherein
said first, second and third piezoelectric thin films are formed of lead zirconate titanate (PZT), or a lead zirconate titanate (PZT) system added with at least one item among the group of Mg, Nb and Mn.

16. The thin film micromechanical resonator gyro of claim 15, wherein
said first, second and third piezoelectric thin films have a rhombohedral crystalline structure with a (001) crystal plane thereof in parallel with said at least one main surface, or a tetragonal crystalline structure with a (111) crystal plane thereof in parallel with said at least one main surface.

17. A thin film micromechanical resonator gyro comprising:
1) a tuning fork having at least two arms and at least one stem connecting said arms, formed of a non-piezoelectric material;
2) a drive section including
   (a) a first electrode provided on at least one main surface of at least one of said arms in a place inner than a center line of the main surface,
   (b) a second electrode provided on said at least one main surface in a place outer than the center line with a separation from said first electrode,
   (c) a first piezoelectric thin film provided on said first electrode,
   (d) a second piezoelectric thin film provided on said second electrode,
   (e) a third electrode provided on said first piezoelectric thin film, and
   (f) a fourth electrode provided on said second piezoelectric thin film; and
(3) a sensing section provided on said at least one main surface of said at least one of arms, wherein
said tuning fork resonates in the direction perpendicular to said center line (X direction) when an alternating voltage is applied to said third and fourth electrodes at opposite phases each other, and
said sensing section detects flexion of said arm due to an angular velocity given thereto, caused in the direction perpendicular to said main surface (Z direction) in proportion to the Coriolis force, as an electrical or optical output, wherein
said sensing section including i) a fifth electrode provided on said at least one main surface in a place further to an end portion of said arm than said first and second electrodes, with a separation from said first and second electrodes,
ii) a third piezoelectric thin film provided on said fifth electrode, and
iii) a sixth electrode provided on said third piezoelectric thin film; further comprising a lead section which includes
i) a first lead out electrode provided between said first and second electrodes with a separation from the electrodes, the first lead out electrode being connected with said fifth electrode,
ii) a fourth piezoelectric thin film provided on said first lead out electrode, and
iii) a second lead out electrode provided on said fourth piezoelectric thin film and connected with said sixth electrode, wherein
said sixth electrode detects an electric charge caused by vibration due to flexion of said arm.

18. The thin film micromechanical resonator gyro of claim 17, wherein said tuning fork structure is formed of Si (silicon).

19. The thin film micromechanical resonator gyro of claim 18, wherein
a (1-11) crystal plane or a (-111) crystal plane of a (110) crystal plane wafer of the Si is disposed perpendicular to said resonance direction (X direction).

20. The thin film micromechanical resonator gyro of claim 18, wherein
a (010) crystal plane, a (011) crystal plane or a (001) crystal plane of a (100) crystal plane wafer of the Si is disposed perpendicular to said resonance direction (X direction).

21. The thin film micromechanical resonator gyro of claim 18, wherein
each of said first, second and fifth electrodes and said first lead out electrode disposed on said at least one main surface includes a Ti layer disposed at a lower part thereof and a Pt —Ti layer disposed at an upper part thereof.

22. The thin film micromechanical resonator gyro of claim 21, wherein
a layer of lead titanate added with lanthanum and magnesium (PLMT) is further provided between said Pt—Ti layer and said piezoelectric thin film.

23. The thin film micromechanical resonator gyro of claim 17, wherein
said piezoelectric thin film is formed of lead zirconate titanate (PZT), or a lead zirconate titanate (PZT) system added with at least one item among a group of Mg, Nb and Mn.

24. The thin film micromechanical resonator gyro of claim 23, wherein
said piezoelectric thin film has a rhombohedral crystalline structure wherein the (001) crystal plane is in parallel with said at least one main surface, or a tetragonal crystalline structure wherein the (111) crystal plane is in parallel with said at least one main surface.

25. The thin film micromechanical resonator gyro of claim 17, wherein
said drive section is disposed on said at least one main surface of said at least one of said arms in a place from a substantially middle of said at least one main surface to a vicinity of the stem.

26. The thin film micromechanical resonator gyro of claim 17, wherein
   each of said third, fourth and sixth electrodes and said second lead out electrode includes a Ti layer disposed at a lower part thereof and an Au layer disposed at an upper part thereof.

27. The thin film micromechanical resonator gyro of claim 17, wherein
   said first, second, third, fourth, fifth and sixth electrodes, said first and second lead out electrodes, and said first, second, third and fourth piezoelectric thin films are disposed substantially symmetric to said center line.

28. The thin film micromechanical resonator gyro of claim 17, wherein
   an alternating voltage is applied to said first and fourth electrodes at the same phase, to said second and third electrodes at the same phase, while to said first and second electrodes at opposite phases each other.

29. A navigation system which includes a thin film micromechanical resonator gyro, said thin film micromechanical resonator gyro comprising:
   (1) a tuning fork having at least two arms and at least one stem connecting said arms, formed of a non-piezoelectric material;
   (2) a drive section including
      (a) a first electrode provided on at least one main surface of at least one of said arms in a place inner than a center line of the main surface,
      (b) a second electrode provided on said at least one main surface in a place outer than the center line with a separation from said first electrode,
      (c) a first piezoelectric thin film provided on said first electrode,
      (d) a second piezoelectric thin film provided on said second electrode,
      (e) a third electrode provided on said first piezoelectric thin film, and
      (f) a fourth electrode provided on said second piezoelectric thin film; and
   (3) a sensing section provided on said at least one main surface of said at least one of arms, wherein
   said tuning fork resonates in the direction perpendicular to said center line (X direction) when an alternating voltage is applied to said third and fourth electrodes at an inverse phase to each other, and
   said sensing section detects flexion of said arm due to an angular velocity given thereto, caused in the direction perpendicular to said main surface (Z direction) in proportion to the Coriolis force, as an electrical or optical output, wherein
   said sensing section including
      i) a fifth electrode provided on said at least one main surface in a place further to an end portion of said arm than said first and second electrodes, with a separation from said first and second electrodes,
      ii) a third piezoelectric thin film provided on said fifth electrode, and
      iii) a sixth electrode provided on said third piezoelectric thin film; further comprising a lead section which includes
      i) a first lead out electrode provided between said first and second electrodes with a separation from the electrodes, the first lead out electrode being connected with said fifth electrode,
      ii) a fourth piezoelectric thin film provided on said first lead out electrode, and
      iii) a second lead out electrode provided on said fourth piezoelectric thin film and connected with said sixth electrode, wherein
   said sixth electrode detects an electric charge caused by vibration due to flexion of said arm.

30. An automobile which includes a thin film micromechanical resonator gyro, used as a sensor for detecting one of a yaw rate, a rolling and a pitching, said thin film micromechanical resonator gyro comprising:
   (1) a tuning fork having at least two arms and at least one stem connecting said arms, formed of a non-piezoelectric material;
   (2) a drive section including
      (a) a first electrode provided on at least one main surface of at least one of said arms in a place inner than a center line of the main surface,
      (b) a second electrode provided on said at least one main surface in a place outer than the center line with a separation from said first electrode,
      (c) a first piezoelectric thin film provided on said first electrode,
      (d) a second piezoelectric thin film provided on said second electrode,
      (e) a third electrode provided on said first piezoelectric thin film, and
      (f) a fourth electrode provided on said second piezoelectric thin film; and
   (3) a sensing section provided on said at least one main surface of said at least one of arms, wherein
   said tuning fork resonates in the direction perpendicular to said center line (X direction) when an alternating voltage is applied to said third and fourth electrodes at an inverse phase to each other, and
   said sensing section detects flexion of said arm due to an angular velocity given thereto, caused in the direction perpendicular to said main surface (Z direction) in proportion to the Coriolis force, as an electrical or optical output, wherein
   said sensing section including
      i) a fifth electrode provided on said at least one main surface in a place further to an end portion of said arm than said first and second electrodes, with a separation from said first and second electrodes,
      ii) a third piezoelectric thin film provided on said fifth electrode, and
      iii) a sixth electrode provided on said third piezoelectric thin film; further comprising a lead section which includes
      i) a first lead out electrode provided between said first and second electrodes with a separation from the electrodes, the first lead out electrode being connected with said fifth electrode,
      ii) a fourth piezoelectric thin film provided on said first lead out electrode, and
      iii) a second lead out electrode provided on said fourth piezoelectric thin film and connected with said sixth electrode, wherein
   said sixth electrode detects an electric charge caused by vibration due to flexion of said arm.

31. A navigation system using a thin film micromechanical resonator gyro, said thin film micromechanical resonator gyro comprising:
   (1) a tuning fork having at least two arms and at least one stem connecting said arms, formed of a non-piezoelectric material;

(2) a drive section including
   (a) a first electrode provided on at least one main surface of at least one of said arms in a place inner than a center line of the main surface,
   (b) a second electrode provided on said at least one main surface in a place outer than the center line with a separation from said first electrode,
   (c) a first piezoelectric thin film provided on said first electrode,
   (d) a second piezoelectric thin film provided on said second electrode,
   (e) a third electrode provided on said first piezoelectric thin film, and
   (f) a fourth electrode provided on said second piezoelectric thin film; and
(3) a sensing section provided on said at least one main surface of said at least one of arms, wherein
said tuning fork resonates in the direction perpendicular to said center line (X direction) when an alternating voltage is applied to said third and fourth electrodes at an inverse phase to each other, and
said sensing section detects flexion of said arm due to an angular velocity given thereto, caused in the direction perpendicular to said main surface (Z direction) in proportion to the Coriolis force, as an electrical or optical output,
wherein
said sensing section includes a fifth electrode disposed on said at least one main surface with a separation from said first and second electrodes, a third piezoelectric thin film provided on said fifth electrode, and a sixth electrode provided on said third piezoelectric thin film
wherein said fifth electrode is disposed in a place further to an end of said arm than said first and second electrodes,
a first lead out electrode is provided between said first and second electrodes with a separation from the electrodes,
said fifth electrode is connected with said first lead out electrode,
at least circumference portions of said first and second electrodes and said first and second piezoelectric thin films, and said first lead out electrode are covered with an insulating layer,
a second lead out electrode is provided between said third and fourth electrodes on said insulating layer with a separation from said third and fourth electrodes,
said sixth electrode is connected with said second lead out electrode, and
said first and second electrodes, said third and fourth electrodes, said fifth and sixth electrodes, said first and second lead out electrodes, said first and second piezoelectric thin films, and said third piezoelectric thin film are disposed substantially symmetric to said center line.

32. An automobile using a thin film micromechanical resonator gyro for detecting one of a yaw rate, a rolling and a pitching, said thin film micromechanical resonator gyro comprising
(1) a tuning fork having at least two arms and at least one stem connecting said arms, formed of a non-piezoelectric material;

(2) a drive section including
   (a) a first electrode provided on at least one main surface of at least one of said arms in a place inner than a center line of the main surface,
   (b) a second electrode provided on said at least one main surface in a place outer than the center line with a separation from said first electrode,
   (c) a first piezoelectric thin film provided on said first electrode,
   (d) a second piezoelectric thin film provided on said second electrode,
   (e) a third electrode provided on said first piezoelectric thin film, and
   (f) a fourth electrode provided on said second piezoelectric thin film; and
(3) a sensing section provided on said at least one main surface of said at least one of arms, wherein
said tuning fork resonates in the direction perpendicular to said center line (X direction) when an alternating voltage is applied to said third and fourth electrodes at an inverse phase to each other, and
said sensing section detects flexion of said arm due to an angular velocity given thereto, caused in the direction perpendicular to said main surface (Z direction) in proportion to the Coriolis force, as an electrical or optical output,
wherein
said sensing section includes a fifth electrode disposed on said at least one main surface with a separation from said first and second electrodes, a third piezoelectric thin film provided on said fifth electrode, and a sixth electrode provided on said third piezoelectric thin film
wherein
said fifth electrode is disposed in a place further to an end of said arm than said first and second electrodes,
a first lead out electrode is provided between said first and second electrodes with a separation from the electrodes,
said fifth electrode is connected with said first lead out electrode,
at least circumference portions of said first and second electrodes and said first and second piezoelectric thin films, and said first lead out electrode are covered with an insulating layer,
a second lead out electrode is provided between said third and fourth electrodes on said insulating layer with a separation from said third and fourth electrodes,
said sixth electrode is connected with said second lead out electrode, and
said first and second electrodes, said third and fourth electrodes, said fifth and sixth electrodes, said first and second lead out electrodes, said first and second piezoelectric thin films, and said third piezoelectric thin film are disposed substantially symmetric to said center line.

* * * * *